US008787087B2

(12) United States Patent
Maeda

(10) Patent No.: US 8,787,087 B2
(45) Date of Patent: Jul. 22, 2014

(54) SEMICONDUCTOR MEMORY DEVICE CONTROLLING OPERATION TIMING OF THE SENSE CIRCUIT

(75) Inventor: Takashi Maeda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

(21) Appl. No.: 13/423,424

(22) Filed: Mar. 19, 2012

(65) Prior Publication Data

US 2013/0070528 A1 Mar. 21, 2013

(30) Foreign Application Priority Data

Sep. 20, 2011 (JP) ................................. 2011-205202

(51) Int. Cl.
*G11C 16/04* (2006.01)
(52) U.S. Cl.
USPC ............ 365/185.11; 365/185.21; 365/185.22; 365/185.24
(58) Field of Classification Search
CPC ......... G11C 16/08; G11C 16/10; G11C 16/16
USPC .............. 365/185.11, 185.21, 185.22, 185.24
See application file for complete search history.

(56) References Cited

U.S. PATENT DOCUMENTS

| 7,023,736 | B2 | 4/2006 | Cernea et al. |
| 7,046,568 | B2 | 5/2006 | Cernea |
| 7,196,931 | B2 | 3/2007 | Cernea et al. |
| 7,852,678 | B2 | 12/2010 | Cernea |
| 7,936,004 | B2 | 5/2011 | Kito et al. |
| 8,107,286 | B2 * | 1/2012 | Itagaki et al. ............ 365/185.02 |
| 8,427,415 | B2 * | 4/2013 | Morita .......................... 345/100 |
| 8,427,877 | B2 * | 4/2013 | He et al. .................... 365/185.21 |
| 2010/0207195 | A1 | 8/2010 | Fukuzumi et al. |

FOREIGN PATENT DOCUMENTS

JP      2006-79803      3/2006

OTHER PUBLICATIONS

H. Tanaka, et al., "Bit Cost Scalable Technology with Punch and Plug Process for Ultra High Density Flash Memory", Symp. on VLSI Technology, 2007, pp. 14-15.
Ryota Katsumata, et al., "Pipe-shaped BiCS Flash Memory with 16 Stacked Layers and Multi-Level-Cell Operation for Ultra High Density Storage Devices", Symp. on VLSI Technology, 2009, pp. 136-137.
Takashi Maeda, et al., "Multi-stacked 1G cell/layer Pipe-shaped BiCS Flash Memory", Symp. on VLSI Circuits, 2009, pp. 22-23.
Office Action issued Feb. 12, 2014, in Japanese Patent Application No. 2011-205202 filed Sep. 20, 2011, with English translation.

* cited by examiner

*Primary Examiner* — Connie Yoha
(74) *Attorney, Agent, or Firm* — Oblon, Spivak, McClelland, Maier & Neustadt, L.L.P.

(57) ABSTRACT

According to one embodiment, a semiconductor memory device includes a memory cell array, a bit line, a source line, and a sense circuit. The memory cell array includes memory strings which include memory cells connected in series and stacked above a semiconductor substrate. The bit line is coupled to one of the memory strings and is capable of transferring data. The source line is coupled to one of the memory strings. When data is read, a read current flows from a bit line into the source line. The sense circuit is coupled to the bit line and senses read data. An operation timing of the sense circuit is determined on the basis of a current flowing through the source line.

16 Claims, 14 Drawing Sheets

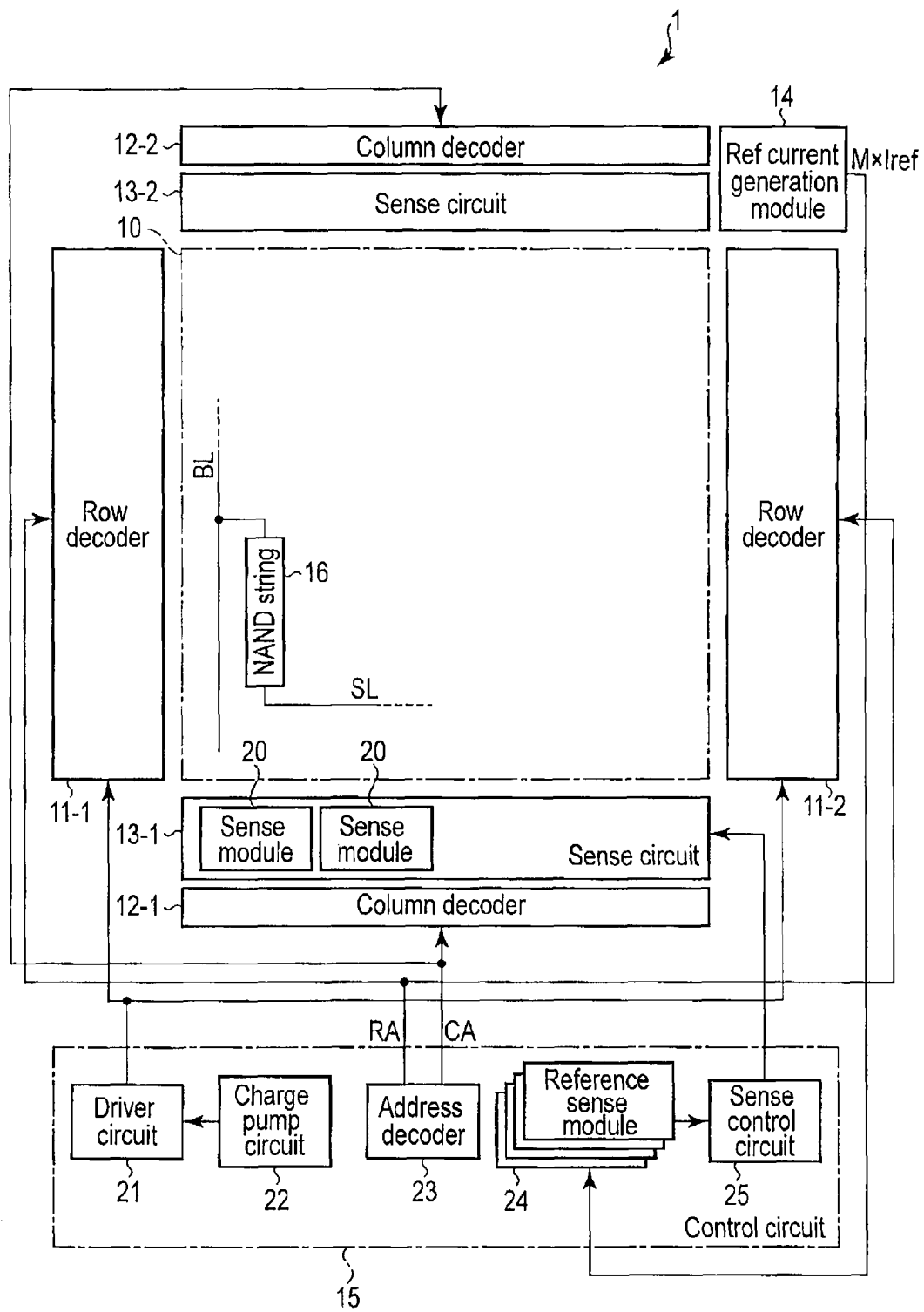
F I G. 1

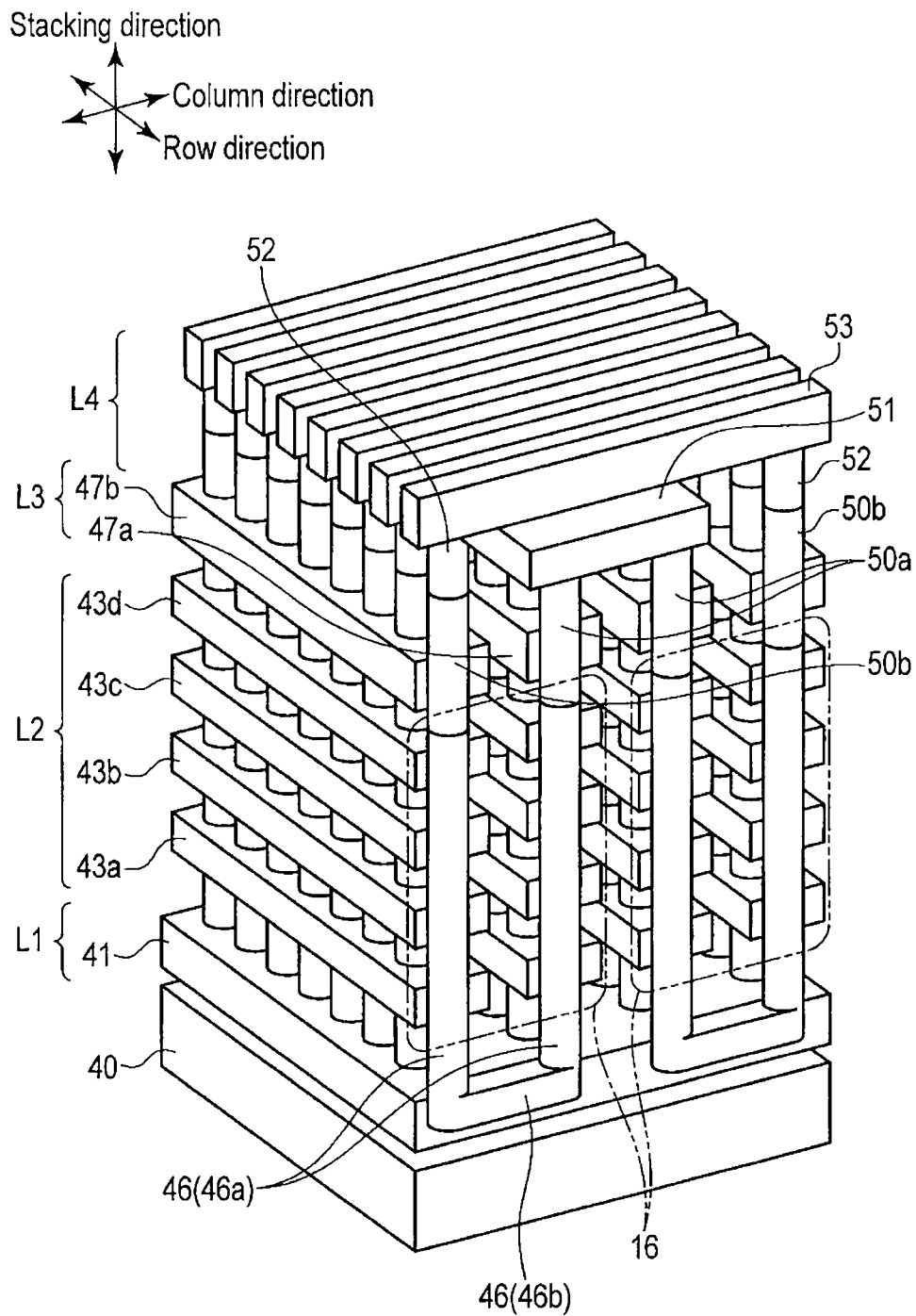
F I G. 3

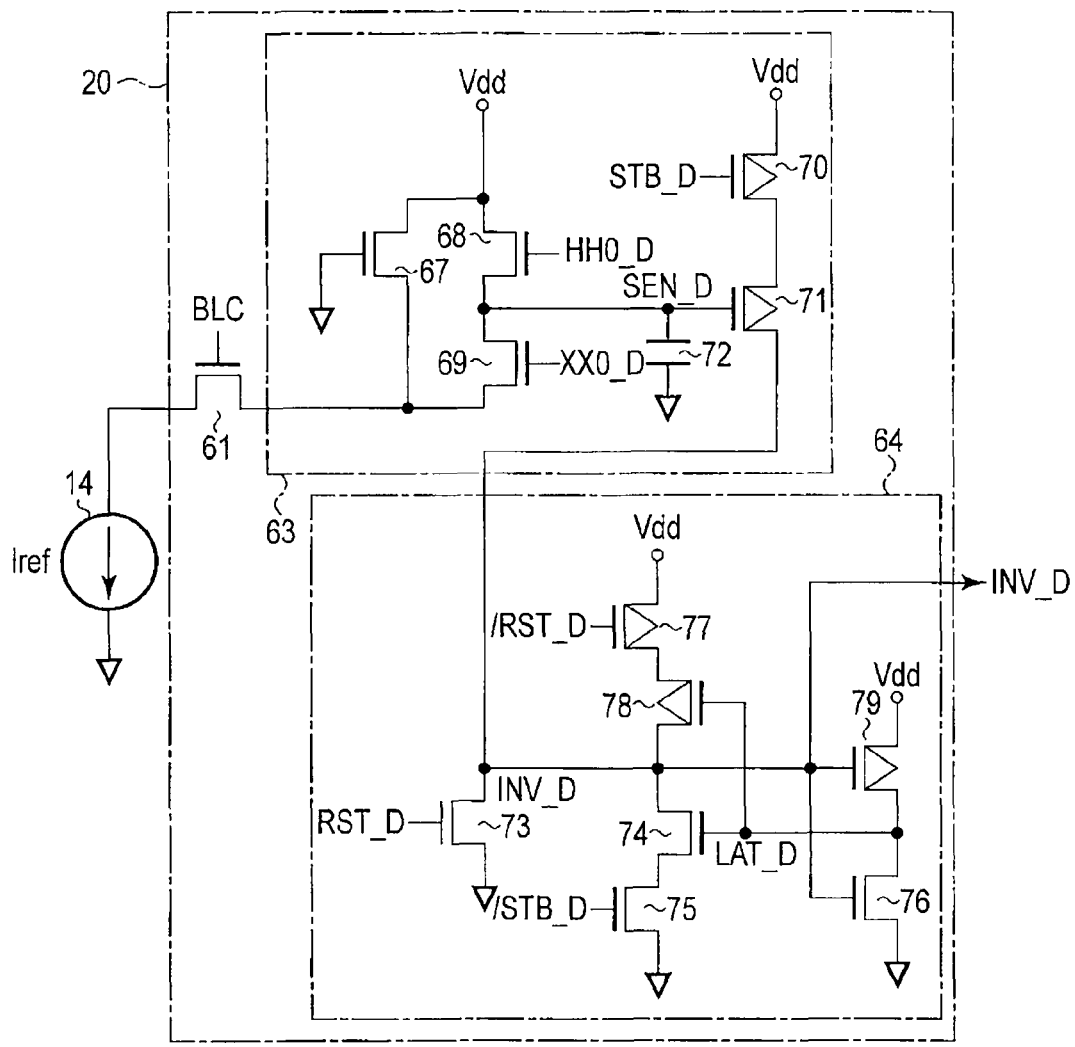
F I G. 7
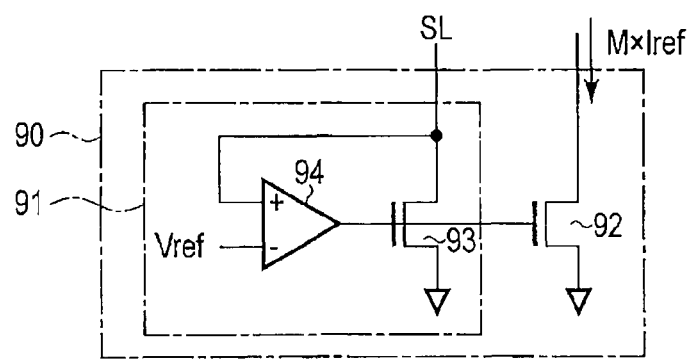
F I G. 8

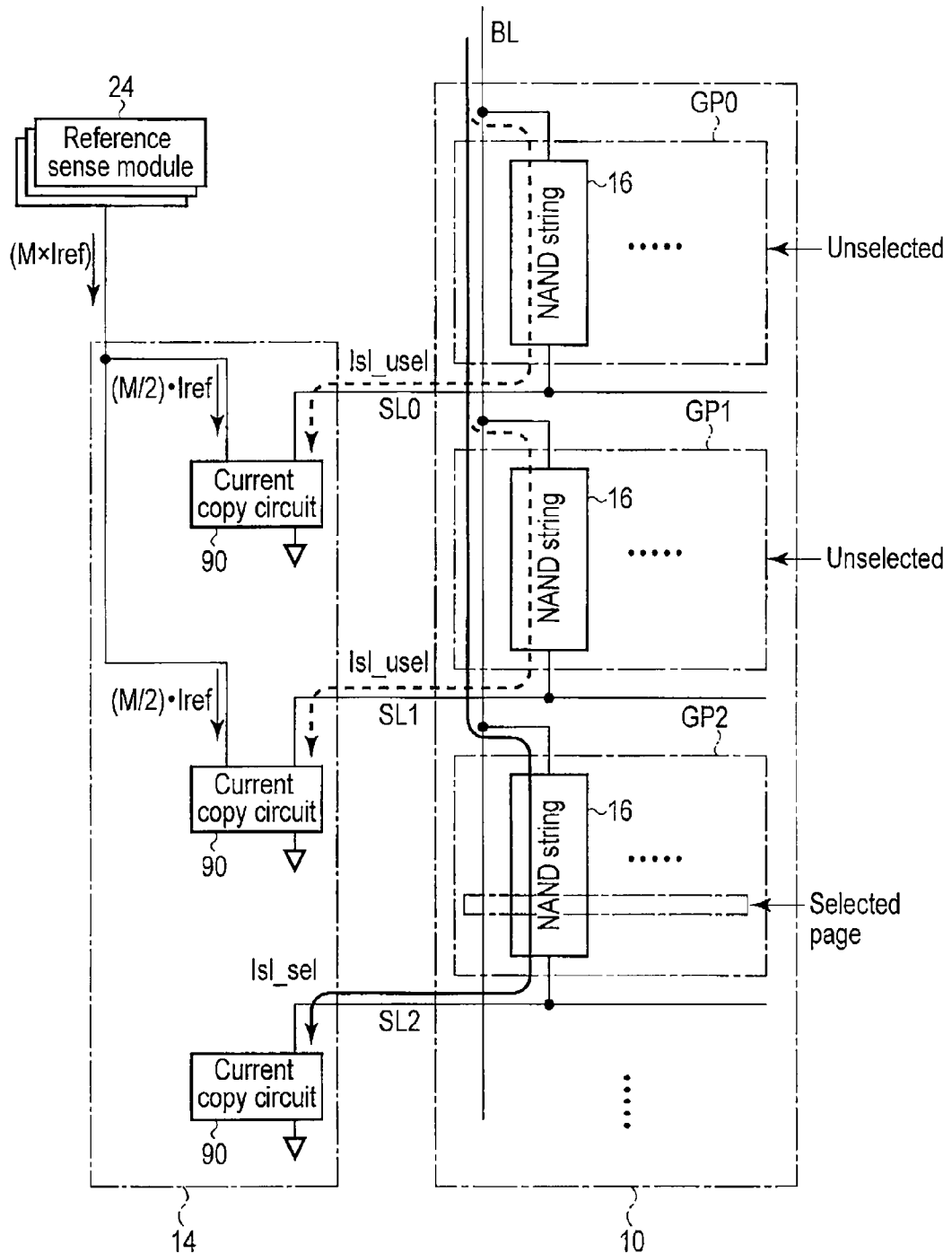
F I G. 10

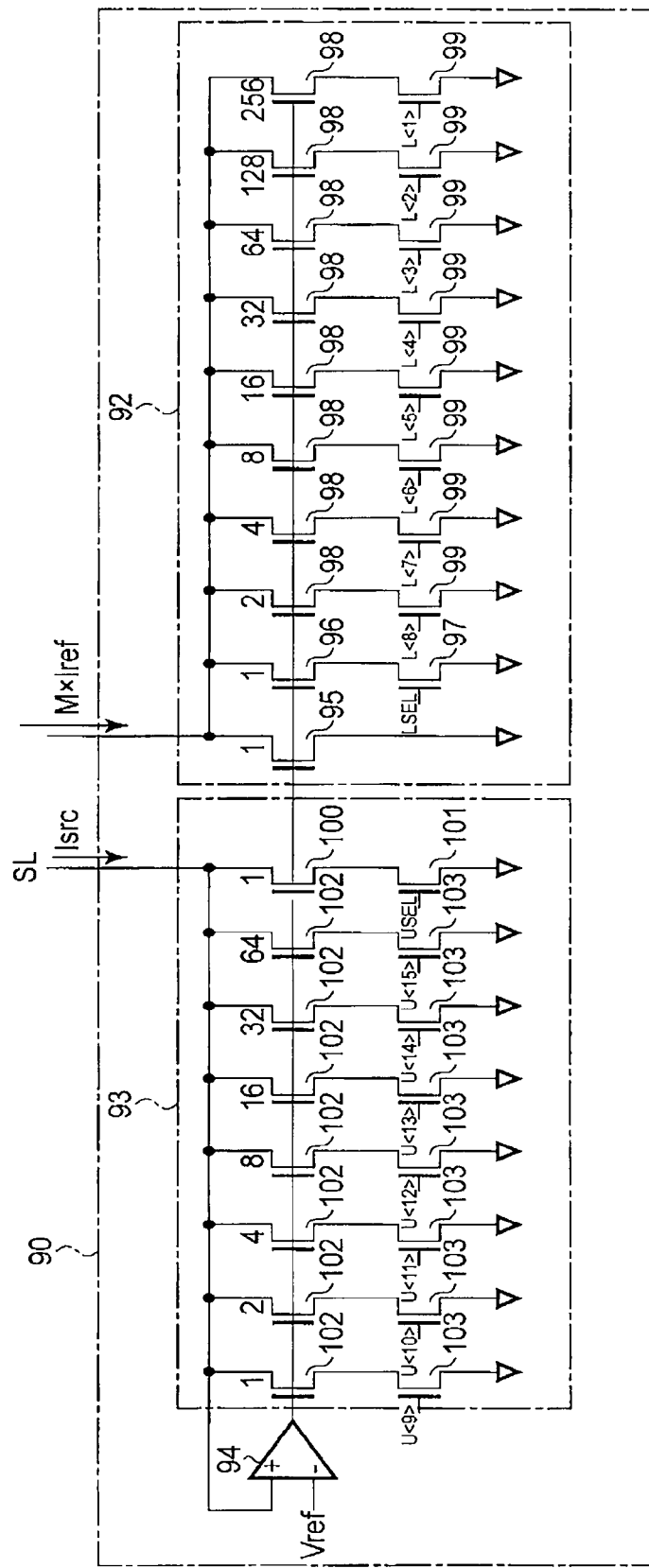
F I G. 12

| Setting | N2 | Isrc side | Iref side |
|---|---|---|---|
| 1 | 0~1 | 1 | 512 |
| 2 | 2~3 | 1 | 256 |
| 3 | 4~7 | 1 | 128 |
| 4 | 8~15 | 1 | 64 |
| 5 | 16~31 | 1 | 32 |
| 6 | 32~63 | 1 | 16 |
| 7 | 64~127 | 1 | 8 |
| 8 | 128~255 | 1 | 4 |
| 9 | 256~511 | 1 | 2 |
| 10 | 512~1023 | 1 | 1 |
| 11 | 1024~1535 | 2 | 1 |
| 12 | 1536~2047 | 3 | 1 |
| 13 | 2048~2559 | 4 | 1 |
| ⋮ | ⋮ | ⋮ | ⋮ |
| 144 | 65024~65535 | 127 | 1 |
| 145 | 65536 | 128 | 1 |
F I G. 13
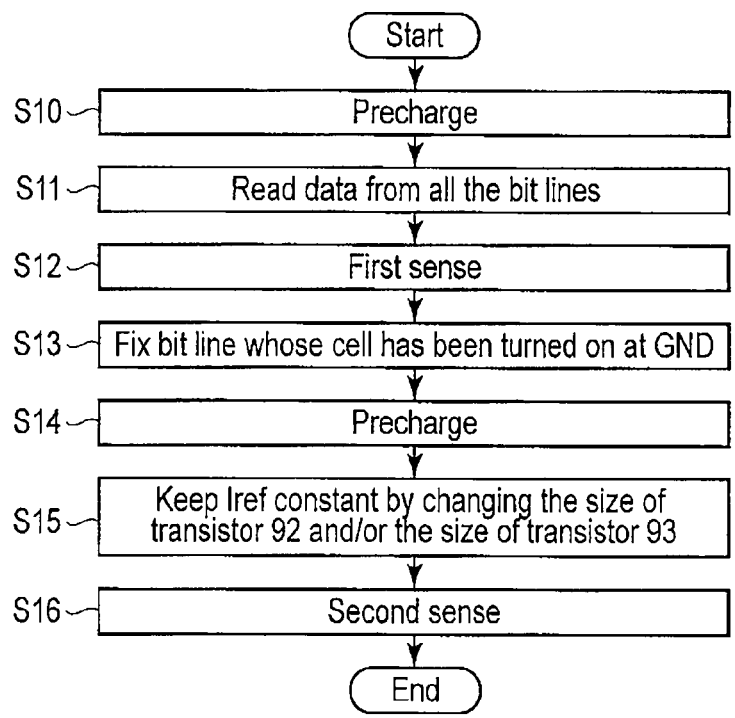
F I G. 14

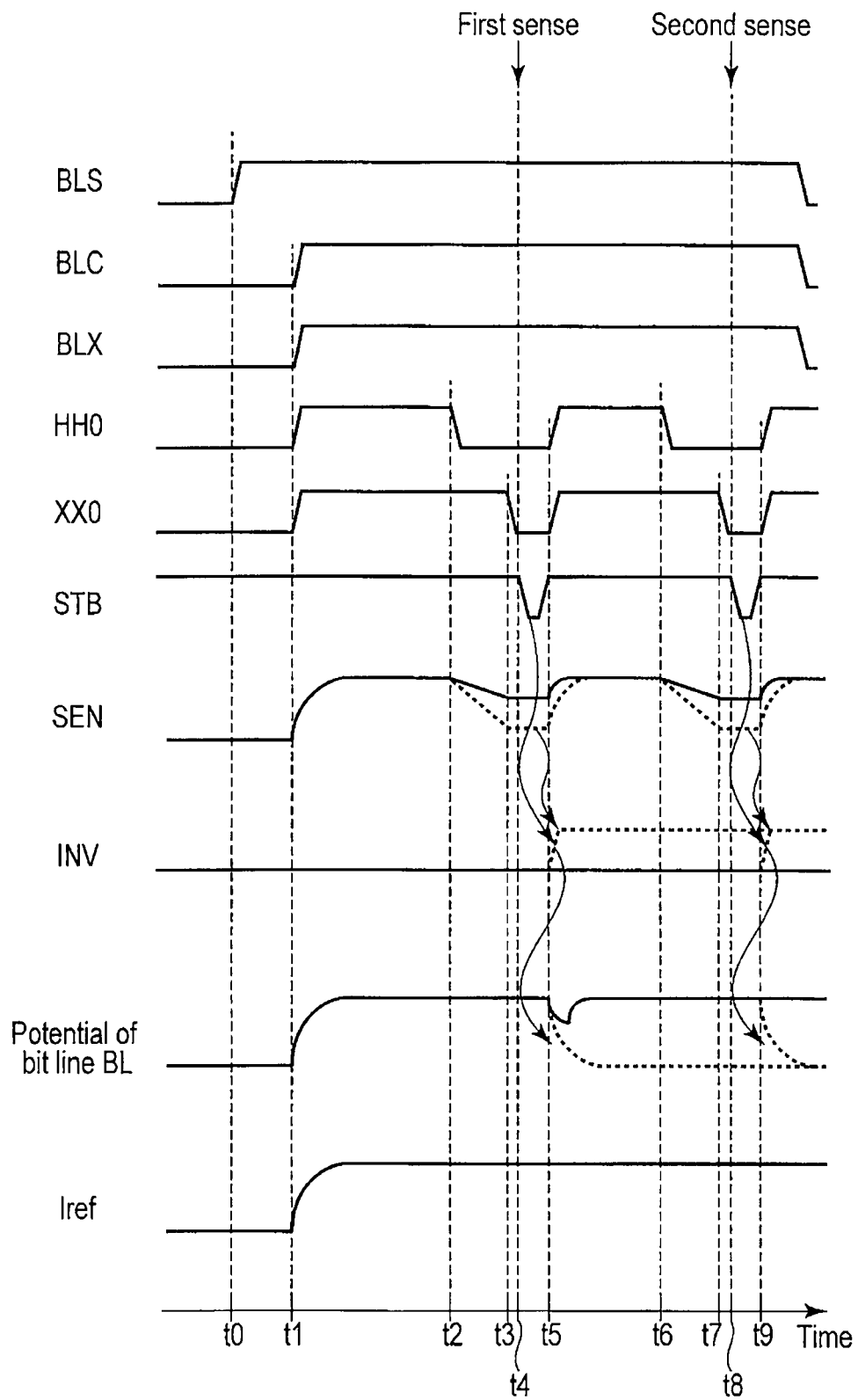
F I G. 15

| Setting | N2 | M' | Isrc side | Iref side |
|---|---|---|---|---|
| 1 | 1 | 1 | 1 | 4 |
| 2 | 2 | 1 | 2 | 4 |
| 3 | 3 | 1 | 3 | 4 |
| 4 | 4 | 1 | 4 | 4 |
| ⋮ | ⋮ | ⋮ | ⋮ | ⋮ |
| 127 | 127 | 1 | 127 | 4 |
| 128 | 128~255 | 1 | 128 | 4 |
| 129 | 256~383 | 2 | 128 | 4 |
| 130 | 384~511 | 3 | 128 | 4 |
| 131 | 512~639 | 4 | 128 | 4 |
| ⋮ | ⋮ | ⋮ | ⋮ | ⋮ |
| 638 | 65408~65535 | 511 | 128 | 4 |
| 639 | 65536 | 512 | 128 | 4 |

US 8,787,087 B2

SEMICONDUCTOR MEMORY DEVICE CONTROLLING OPERATION TIMING OF THE SENSE CIRCUIT

CROSS-REFERENCE TO RELATED APPLICATIONS

This application is based upon and claims the benefit of priority from prior Japanese Patent Application No. 2011-205202, filed Sep. 20, 2011, the entire contents of which are incorporated herein by reference.

FIELD

Embodiments described herein relate generally to a semiconductor memory device.

BACKGROUND

Recent years have seen a remarkable progress in the miniaturization of semiconductor memories, including a NAND flash memory. Under such circumstances, it has become difficult to maintain the operation reliability of semiconductor memories.

BRIEF DESCRIPTION OF THE DRAWINGS

FIG. 1 is a block diagram of a semiconductor memory device according to a first embodiment;

FIG. 3 and FIG. 4 are a perspective view and a sectional view of the memory cell array according to the first embodiment, respectively;

FIG. 6 to FIG. 8 are circuit diagrams of a sense module, a reference sense module, and a current copy circuit according to the first embodiment;

FIG. 10 is a block diagram of a memory cell array and a reference current generation module according to a modification of the first embodiment;

FIG. 12 is a circuit diagram of a current copy circuit according to a third embodiment;

FIG. 13 is a table showing reference currents generated by the current copy circuit according to the third embodiment;

FIG. 14 is a flowchart to explain a data reading method according to the third embodiment;

FIG. 15 is a timing chart to explain various signals during the operation of a sense module according to the third embodiment;

DETAILED DESCRIPTION

Figure 2:
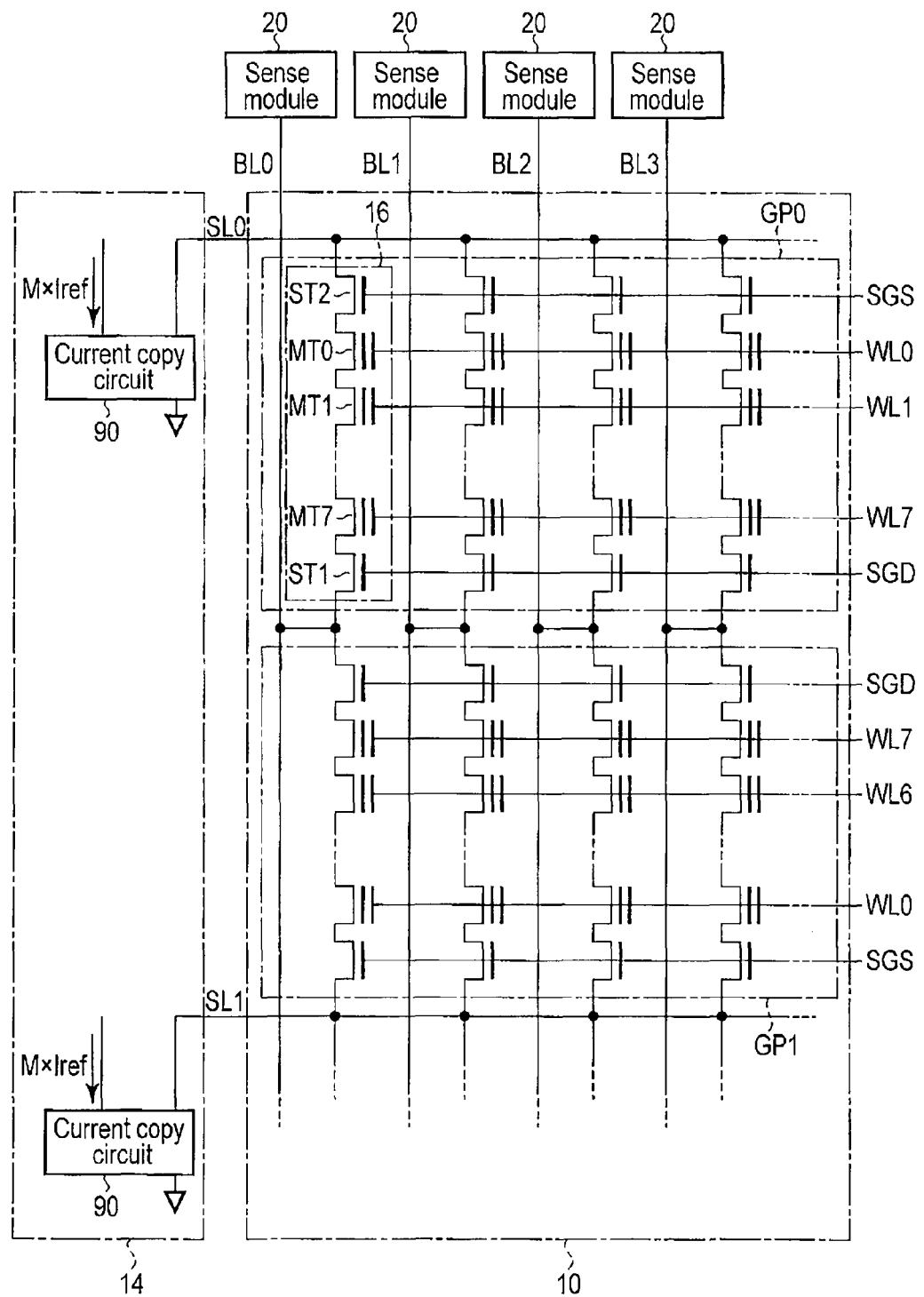
FIG. 2 is a block diagram of a memory cell array and a reference current generation module according to the first embodiment.

In general, according to one embodiment, a semiconductor memory device includes a memory cell array, a bit line, a source line, and a sense circuit. The memory cell array includes memory strings which include memory cells connected in series and stacked above a semiconductor substrate. The bit line is coupled to one of the memory strings and is capable of transferring data. The source line is coupled to one of the memory strings. When data is read, a read current flows from the bit line into the source line. The sense circuit is coupled to the bit line and senses read data. An operation timing of the sense circuit is determined on the basis of a current flowing through the source line.

First Embodiment

A semiconductor memory device according to a first embodiment will be explained, taking, as an example, a three-dimensional stacked NAND flash memory where memory cells are stacked above a semiconductor substrate.

1. Configuration of Semiconductor Memory Device

First, the configuration of a semiconductor memory device according to the first embodiment will be explained.

1.1 Overall Configuration of Semiconductor Memory Device

FIG. 1 is a block diagram of a semiconductor memory device according to the first embodiment. As shown in FIG. 1, the semiconductor memory device 1 includes a memory cell array 10, row decoders 11 (11-1, 11-2), column decoders 12 (12-1, 12-2), sense circuits 13 (13-1, 13-2), a reference current generation module 14, and a control module 15.

The memory cell array 10 includes a plurality of NAND strings 16 each of which has nonvolatile memory cells connected in series. A word line (not shown) is connected to the gates of the memory cells in a NAND string 16. A bit line BL is connected to the drain of a memory cell at one end of the NAND string 16. A source line SL is connected to the source of a memory cell at the other end of the NAND string 16.

The row decoders 11 select a row direction of the memory cell array 10. In other words, when data is written or read, the row decoders 11 select any one of the word lines and apply necessary voltages to the selected word line and the unselected word lines. Only either the row decoder 11-1 or 11-2 may be provided.

The sense circuits 13 include sense modules 20 provided for bit lines BL in a one-to-one correspondence. When data is read, each of the sense modules 20 senses and amplifies data read onto the corresponding bit line BL. When data is written, the sense module transfers write data to the corresponding bit line BL. Only either the sense circuit 13-1 or 13-2 may be provided.

The column decoders 12 select a column direction of the memory cell array 10. In other words, when write data or read data is transferred, the column decoders 12 select any one of the sense modules 20. Only either the column decoder 12-1 or 12-2 may be provided.

When data is read, the reference current generation module 14 generates a reference current on the basis of a current flowing through the source line SL and supplies the reference current to reference sense modules 24 described later. If the number of reference sense modules 24 is M (M being a natural number), the generation module 14 generates as large a current as equals to (M×Iref) and supplies Iref to each of the reference sense modules 24.

The control circuit 15 controls the operation of the semiconductor memory device 1. Specifically, the control circuit 15 includes a driver circuit 21, a charge pump circuit 22, an address decoder 23, an M number of reference sense modules 24, and a sense control circuit 25.

In response to an instruction from, for example, a state machine (not shown), the charge pump circuit 22 generates voltages necessary to write, read, or erase data and supplies the voltages to the driver circuit 21.

The driver circuit 21 supplies a necessary one of the voltages supplied from the charge pump circuit 22 to the row decoders 11. The row decoders 11 apply the voltage supplied from the driver circuit 21 to a word line.

The address decoder 23 receives an address from an address buffer (not shown). Then, the address decoder 23 transfers a row address RA to the row decoders 11 and a column address CA to the column decoders 12.

When data is read, the reference sense module 24 senses a reference current Iref supplied from the generation module 14.

The sense control circuit 25 controls the operation timing of the sense circuits 13 on the basis of the sense operation of the reference sense module 24.

1.2 Memory Cell Array

The configuration of the memory cell array 10 will be explained in detail. FIG. 2 is a circuit diagram of the memory cell array 10.

As shown in FIG. 2, the memory cell array includes a plurality of NAND strings arranged in a matrix. Each of the NAND strings 16 includes, for example, eight memory cell transistors MT (MT0 to MT7) and select transistors ST1, ST2. Each of the memory cell transistors MT, which has a stacked gate that includes a control gate and a charge accumulation layer, holds data in a nonvolatile manner. The number of memory cell transistors MT is not limited to eight and may be 16, 32, 64, 128, or the like. That is, the number of memory cell transistors is not restrictive. The memory cell transistors MT are arranged in such a manner that their current paths are connected in series between the select transistors ST1 and ST2. The current path of memory cell transistor MT7 at one end of the series connection is connected to one end of the current path of select transistor ST1. The current path of memory cell transistor MT0 at the other end of the series connection is connected to one end of the current path of select transistor ST2.

The control gates of the memory cell transistors MT in the same row are connected equally to any one of the word lines WL (WL0 to WL7). The gates of the select transistors ST1 of the memory cells in the same row are connected equally to a select gate line SGD. The gates of the select transistors ST2 of the memory cells in the same row are connected equally to a select gate line SGS.

The other end of the current path of select transistor ST1 in the same column in the memory cell array 10 is connected equally to any one of the bit lines BL (BL0, BL1, . . . ). In addition, the other end of the current path of select transistor ST2 is connected equally to a source line SL (SL0, SL1, . . . ). In the first embodiment, the source lines SL are electrically isolated from one another.

Hereinafter, a set of a plurality of NAND strings 16 arranged in the same row is referred to as a memory cell group GP (GP0, GP1, . . . ). In the memory cell array 10, a plurality of memory cell groups GP are arranged along a bit line. Data is read or written in units of memory cell transistors connected to any one of the word lines WL in any one of the memory cell groups GP. The unit is called a page. Data is erased in units of memory cell groups GP. The unit is called a block. In the same block, a word line WL is connected equally even between different memory cell groups GP. That is, in the same block, word line WL0 belonging to a memory cell group GP is connected equally to word line WL0 belonging to another memory cell group GP. This is true for the other word lines. However, the select gate lines SGS, SGD are independent of those of another memory cell group. One or more memory cell groups share the same source line SL.

Figure 4:
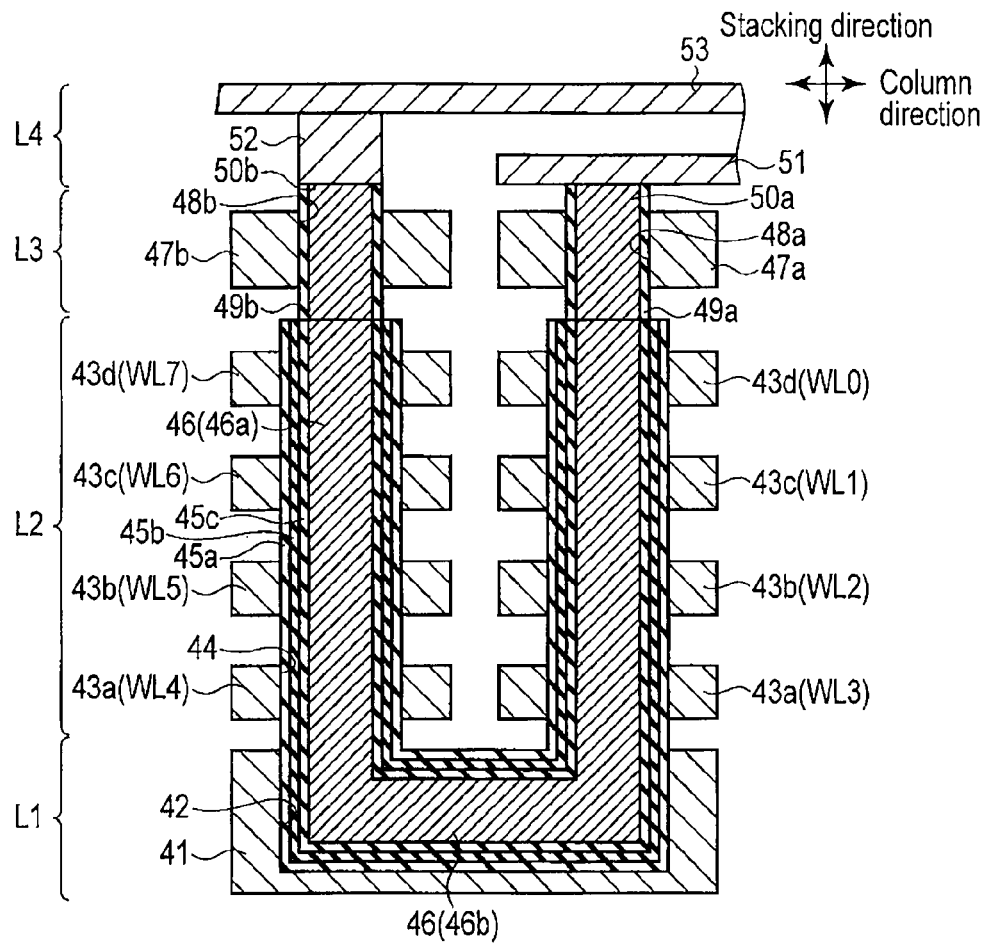

Next, a three-dimensional stacked structure of the memory cell array 10 will be explained with reference to FIGS. 3 and 4. FIGS. 3 and 4 are a perspective view and a sectional view of the memory cell array 10.

As shown in FIG. 3, the memory cell array 10 is provided above a semiconductor substrate 40. The memory cell array 10 includes a back-gate transistor layer L1, a memory cell transistor layer L2, a select transistor layer L3, and an interconnection layer L4 formed in that order above the semiconductor substrate 40.

The back-gate transistor layer L1 functions as a back-gate transistor BT. The memory transistor layer L2 functions as memory cell transistors MT0 to MT7 (NAND string 16). The select transistor layer L3 functions as select transistor ST1, St2. The interconnection layer L4 functions as source lines SL and bit lines BL.

The back-gate transistor layer L1 includes a back-gate conductive layer 41. The back-gate conductive layer 41 is formed so as to expand two-dimensionally in a row direction and a column direction parallel with the semiconductor substrate 40. The back-gate conductive layer 41 is segmented in memory blocks. A memory block, which is a set of memory cell groups GP, is a unit in erasing data. The back-gate conductive layer 41 is made of, for example, polysilicon. The back-gate conductive layer 41 functions as back-gate lines BG.

In addition, the back-gate conductive layer 41 has a back-gate hole in it as shown in FIG. 4. The back-gate hole 42 is made so as to recess the back-gate conductive layer 41. The back-gate hole 42 is made into almost a rectangular shape whose longitudinal direction is in a column direction when viewed from above.

The memory cell transistor layer L2 is formed in the upper layer of the back-gate conductive layer L1. The memory cell transistor layer L2 includes word line conductive layers 43a to 43d. The word line conductive layers 43a to 43d are stacked with interlayer dielectric layers (not shown) being sandwiched between them. The word line conductive layers 43a to 43d are formed into stripes extending in the row direction with a specific pitch in the column direction. The word line conductive layers 43a to 43d are made of, for example, polysilicon. Word line conductive layer 43a functions as control gates (word lines WL3, WL4) of memory cell transistors MT3, MT4. Word line conductive layer 43b functions as control gates (word lines WL2, WL5) of memory cell transistors MT2, MT5. Word line conductive layer 43c functions as control gates (word lines WL1, WL6) of memory cell transistors MT1, MT6. Word line conductive layer 43d functions as control gates (word lines WL0, WL7) of memory cell transistors MT0, MT7.

The memory cell transistor layer L2 has a memory hole 44 in it as shown in FIG. 4. The memory hole 44 is made to extend through the word line conductive layers 43a to 43d. The memory hole 44 is made to align with the end portion of the back-gate hole 42 in the column direction.

In addition, the back-gate transistor layer L1 and memory cell transistor layer L2 include a block insulating layer 45a, a charge accumulation layer 45b, a tunnel insulating layer 45c, and a semiconductor layer 46 as shown in FIG. 4. The semiconductor layer 46 functions as a body (a back-gate of each transistor) of the NAND string 16.

The block insulating layer 45a is formed to a specific thickness on the sidewalls facing the back-gate hole 42 and memory hole 45 as shown in FIG. 4. The charge accumulation layer 45b is formed to a specific thickness on the sidewall of the block insulating layer 45a. The charge accumulation layer 45c is formed to a specific thickness on the sidewall of the charge accumulation layer 45b. The semiconductor layer 46 is formed so as to contact the sidewall of the tunnel insulating layer 45c. The semiconductor layer 46 is formed so as to fill the back-gate hole 42 and memory hole 44.

The semiconductor layer 46 is formed into a U-shape when viewed from the row direction. Specifically, the semiconductor layer 46 includes a pair of columnar parts 46a extending perpendicularly to the surface of the semiconductor substrate 40 and a connecting part 46b that connects the lower ends of the pair of columnar parts 46a.

The block insulating layer 45a and tunnel insulating layer 45c are made of, for example, silicon oxide ($SiO_2$). The charge accumulation layer 45b is made of, for example, silicon nitride (SiN). The semiconductor layer 46 is made of polysilicon. The block insulating layer 45a, charge accumulation layer 45b, tunnel insulating layer 45c, and semiconductor layer 46 form a MONOS transistor functioning as a memory cell transistor MT.

In other words, the tunnel insulating layer 45c is formed so as to surround the connecting part 46b in the configuration of the back-gate transistor layer L1. The back-gate insulating layer 41 is formed so as to surround the connecting part 46b.

Furthermore, the tunnel insulating layer 45c is formed so as to surround the columnar part 46a in the configuration of the memory cell transistor layer L2. The charge accumulation layer 45b is formed so as to surround the tunnel insulating layer 45c. The block insulating layer 45a is formed so as to surround the charge accumulation layer 45b. The word line conductive layers 44a to 44d are formed so as to surround the block insulating layers 45a to 45c and columnar part 46a.

The select transistor layer L3 includes conductive layers 47a and 47b as shown in FIGS. 3 and 4. The conductive layers 47a and 47b are formed into stripes that extend in the row direction so as to have a specific pitch in the column direction. A pair of conductive layers 47a and a pair of conductive layers 47b are arranged alternately in the column direction. The conductive layers 47a are formed in the upper layer of one columnar part 46a and the conductive layers 47b are formed in the upper layer of the other columnar part 46a.

The conductive layers 47a and 47b are made of polysilicon. The conductive layer 47a functions as the gate (select gate line SGS) of select transistor ST2 and the conductive layer 47b functions as the gate (select gate line SGD) of select transistor ST1.

The select transistor layer L3 has holes 48a and 48b in it as shown in FIG. 4. The holes 48a and 48b respectively extend through the conductive layers 47a and 47b, as shown in FIG. 4. The holes 48a and 48b aligns with the memory hole 44.

The select transistor layer L3 includes gate insulating layers 49a and 49b and semiconductor layers 50a and 50b as shown in FIG. 4. The gate insulating layers 49a and 49b are formed on the sidewalls facing the holes 48a and 48b, respectively. The semiconductor layers 50a and 50b are each formed into a columnar shape extending perpendicularly to the surface of the semiconductor substrate 40 so as to contact the gate insulating layers 49a and 49b, respectively.

The gate insulating layers 49a and 49b are made of, for example, silicon oxide ($SiO_2$). The semiconductor layers 50a and 50b are made of, for example, polysilicon.

In other words, the gate insulating layer 49a is formed so as to surround the columnar semiconductor layer 50a in the configuration of the select transistor layer L3. The conductive layer 47a is formed so as to surround the gate insulating layer 49a and semiconductor layer 50a. The gate insulating layer 49b is formed so as to surround the columnar semiconductor layer 50b. The conductive layer 47b is formed so as to surround the gate insulating layer 49b and semiconductor layer 50b.

The interconnection layer L4 is formed in the upper layer of the select transistor L3 as shown in FIGS. 3 and 4. The interconnection layer L4 includes a source line layer 51, a plug layer 52, and a bit line layer 53. The source line layer 51 is formed into a plate extending in the row direction. The source line layer 51 is formed in contact with the upper surfaces of the pair of semiconductor layers 47a adjacent to each other in the column direction. The plug layer 52 is formed in contact with the upper surfaces of the semiconductor layer 47b, so as to extend perpendicularly to the surface of the semiconductor substrate 40. The bit line layer 53 is formed into stripes that extend in the column direction with a specific pitch in the row direction. The bit line layer 53 is formed so as to contact the upper surface of the plug layer 52. The source line layer 51, plug layer 52, and bit line layer 53 are made of such a metal as tungsten (W). The source line layer 51 functions as source lines SL and the bit line layer 53 functions as bit lines BL as explained in FIGS. 1 and 2.

Figure 5:
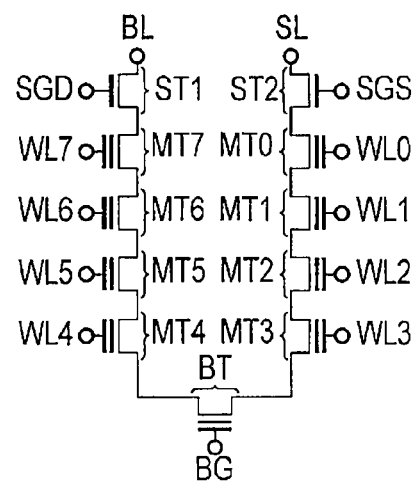
FIG. 5 is an equivalent circuit diagram of a NAND string according to the first embodiment.

FIG. 5 shows an equivalent circuit of the NAND string 16 shown in FIGS. 3 and 4. The configuration of FIG. 5 is equivalent to the configuration of the NAND string of FIG. 2. However, in FIG. 2, the back-gate transistor BT is not shown.

As shown in FIG. 5, the NAND string 16 includes select transistors ST1, ST2, memory cell transistors MT0 to MT7, and back-gate transistors BT. As described above, the memory cell transistors MT are connected in series between the select transistors ST1, ST2. The back-gate transistors BT are connected in series between memory cell transistors MT3 and MT4.

The control gate of a memory cell transistor MT is connected to a word line WL and the control gate of a back-gate transistor BT is connected to a back-gate line BG. When data is written or read, the back-gate transistor BT is always kept on. A set of NAND strings 16 arranged in the row direction in FIG. 3 corresponds to a memory cell group GP explained in FIG. 2.

1.3 Sense Circuit 13

Figure 6:
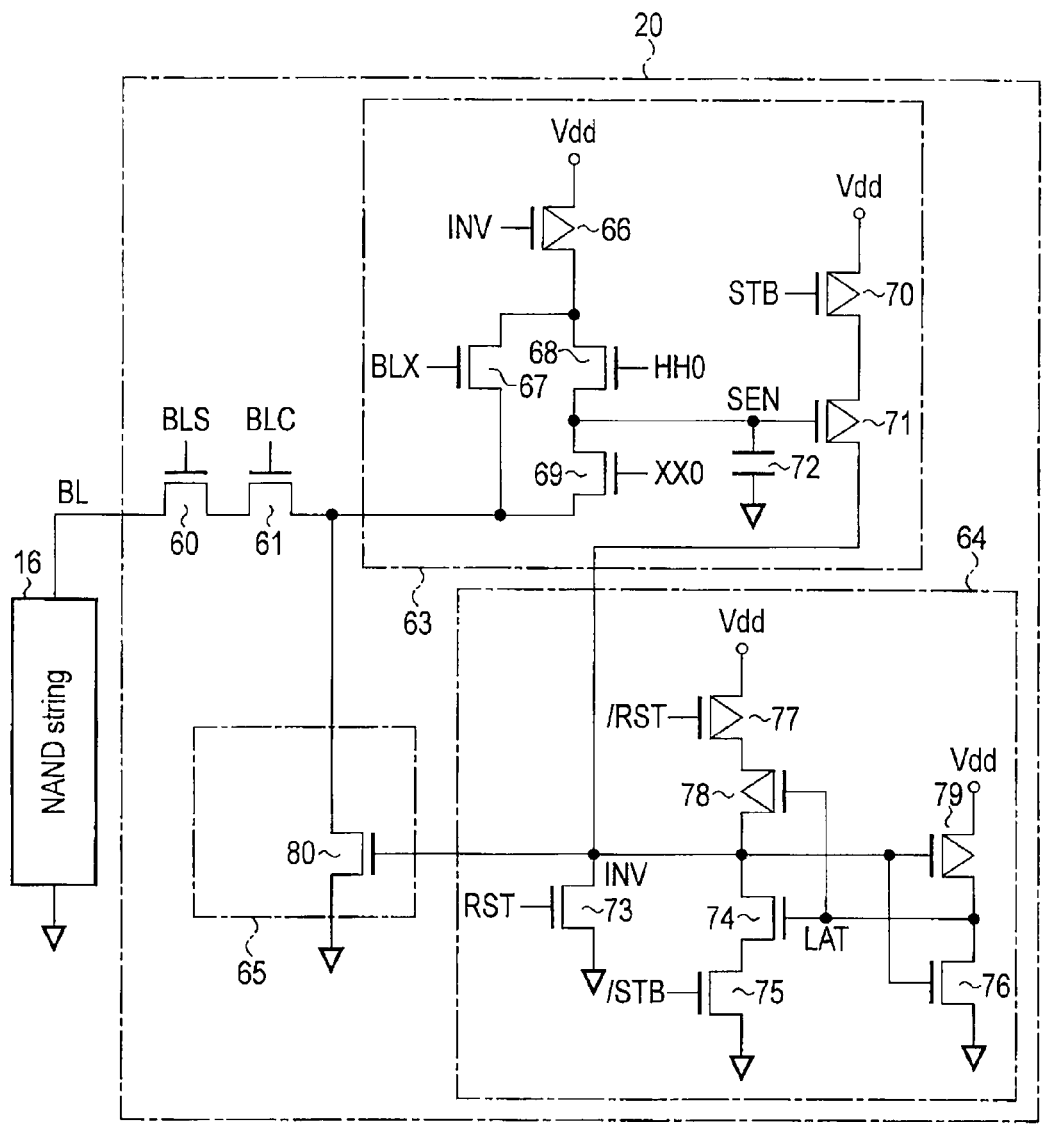

Next, the sense circuit 13 will be explained. As explained in FIG. 1, the sense circuit 13 includes a plurality of sense modules 20 provided for the bit lines BL in a one-to-one correspondence. FIG. 6 is a circuit diagram of a sense module 20.

As shown in FIG. 6, the sense module 20 roughly includes n-channel MOS transistors 60, 61, a sense amplifier 63, a data latch 64, and a pull-down circuit 65.

A signal BLS is supplied to the gate of the transistor 60. The transistor 60 has its source connected to a bit line BL and its drain connected to the source of the transistor 61. The transistor 60 connects the sense module 20 to a bit line BL or disconnects the sense module 20 from the bit line BL. A signal BLC is supplied to the gate of the transistor 61. The transistor 61 controls a precharge potential of a bit line in reading data.

The sense amplifier 63 senses and amplifies a current flowing in a memory cell according to data when data is read. The sense amplifier 63 includes n-channel MOS transistors 67 to 69, p-channel MOS transistors 66, 70, 71, and a capacitive element 72.

The transistor 66 has its gate connected to a node INV. A power supply voltage Vdd is applied to the source of the transistor 66. The transistor 67 precharges a bit line BL. A signal BLX is supplied to the gate of the transistor 67. The transistor 67 has its drain connected to the drain of the transistor 66 and its source connected to the drain of the transistor 61. The transistor 68 charges the capacitive element 72. A signal HH0 is supplied to the gate of the transistor 68. The transistor 68 has its drain connected to the source of the transistor 66 and its source connected to a node SEN. The transistor 69 discharges the capacitive element 72. A signal XX0 is supplied to the gate of the transistor 69. The transistor 69 has its drain connected to a node SEN and its source connected to the drain of the transistor 61. The capacitive element 72 is charged when a bit line BL is precharged. The capacitive element 72 has one electrode connected to the node SEN and the other electrode grounded. The transistor 70 stores read data into the data latch 64. A signal STB is supplied to the gate of the transistor 70. A power supply voltage Vdd is applied to the source of the transistor 70. The transistor 71 senses whether read data is "0" or "1." The transistor 71 has its gate connected to the node SEN, its source connected to the drain of the transistor 70, and its drain connected to the node INV.

The data latch 64 holds read data sensed and amplified by the sense amplifier 63. The data latch 64 includes n-channel MOS transistors 73 to 76 and p-channel MOS transistors 77 to 79.

The MOS transistor 73 resets the node INV. A signal RST is supplied to the gate of the transistor 73. The MOS transistor 73 has its drain connected to the node INV and its source grounded. The transistors 74, 78 constitute a first inverter. The output node of the first inverter is the node INV and its input node is a node LAT. The transistors 76, 79 constitute a second inverter. The output node of the second inverter is the node LAT and its input node is the node INV. The data latch 64 holds data by the first and second inverters. The transistor 77 resets the first and second inverters. The transistor 77 has a gate which receives a signal /RST, a source connected to the power supply voltage Vdd, and a drain connected to a high-voltage supply terminal of the first inverter. The transistor 75 is for loading data sensed by the sense amplifier into the inverter. The transistor 75 has a gate which receives a signal /STB, a source grounded, and a drain connected to a low-voltage supply terminal of the first inverter.

The pull-down circuit 65 pulls down a bit line BL according to the potential of the node INV. The pull-down circuit 65 includes an n-channel MOS transistor 80. The n-channel MOS transistor 80 has its gate connected to the node INV, its source grounded, and its drain connected to the drain of the transistor 61.

1.4 Reference Sense Module 24

Next, the reference sense module 24 will be explained. As explained in FIG. 1, the control circuit 15 includes an M number of reference sense modules 24. FIG. 7 is a circuit diagram of a reference sense module 24.

As shown in FIG. 7, the reference sense module 24 is obtained by modifying the sense module 20 of FIG. 6 as follows:

Transistor 60 is eliminated.
Pull-down circuit 65 is eliminated.
Transistor 66 is eliminated from sense amplifier 63.
The gate of transistor 67 is grounded in sense amplifier 63.
Signal at node INV is output to sense control circuit 25.
Reference current Iref, not read current from a memory cell, is sensed.

The rest is the same as in the sense module 20. In the reference sense module 24, the signals and nodes corresponding to those of the sense module 20 are marked with "_D." For example, node SEN_D of the reference sense module 24 corresponds to node SEN of the sense module 20. In addition, signals HH0_D, XX0_D, RST_D transit with the same timing as signals HH0, XX0, RST.

1.5 Reference Current Generation Module 14

Next, the reference current generation module 14 will be explained. As shown in FIG. 2, the generation module 14 includes current copy circuits 90 provided for source lines SL in a one-to-one correspondence.

When data is read, a current copy circuit 90 generates a reference current Iref on the basis of an off current flowing through an unselected source line SL. The current copy circuit 90 controls the potential of the source line SL.

FIG. 8 is a circuit diagram of the current copy circuit 90. As shown in FIG. 8, the current copy circuit 90 includes a regulator 91 and an n-channel MOS transistor 92.

The regulator 91 controls the voltage of a source line SL on the basis of a reference voltage Vref. As shown in FIG. 8, the regulator 91 includes an n-channel MOS transistor 93 and a comparator 94. The transistor 93 has its gate connected to the output node of the comparator 94, its drain connected to the corresponding source line SL, and its source grounded. The reference voltage Vref is input to the inverting input terminal (−) of the comparator 94. A source line SL is connected to the noninverting input terminal (+) of the comparator 94. The comparator 94 controls the transistor 93 according to the result of comparison between the reference voltage Vref and the potential of the source line SL, thereby maintaining the potential of the source line SL at Vref.

The transistor 92 has its gate connected to the output node of the comparator 94 and its source grounded. The transistor 92 generates a reference current equal to (M×Iref). The transistor 92 supplies a reference current Iref to each of the M number of reference sense modules 24.

A suitable magnitude of reference current Iref is set, for example, as follows. First, an off current ioff per memory cell transistor MT is determined as follows:

$$ioff=(n1/(Np \times Ns)) \times Isrc$$

where n1 is the number of source lines SL in the memory cell array 10, Np is the number of memory cell transistors per page, Ns is the number of NAND strings 16 connected to each bit line, and Isrc is current that flows in a source line SL connected to an unselected memory cell group GP.

Therefore, off current Ioff per bit line is expressed as:

$$Ioff=Ns \times ioff=(n1/Np) \times Isrc$$

where ioff is an off current per memory cell transistor MT.

Then, if the minimum value Ion_min of an on current is (a1×Ioff), Iref is expressed as:

$$Iref = (Ion + Ioff)/2 = ((a1 + 1)/2) \times Ioff$$
$$= ((a1 + 1) \times n1)/(2 \times Np) \times Isrc$$

where a1 is an arbitrary number.

Setting such Iref makes it possible to distinguish between ion and ioff, where ion is an on current per memory cell transistor MT.

To obtain a current equal to (M×Iref), the ratio of the size (e.g., transistor number or gate width) of transistor 93 to that of transistor 92 is expressed as:

$$S0:S1=M \times (a1 \times n1) \times (2 \times Np):1$$

where S0 is the size of transistor 93 and S1 is the size of transistor 92.

Therefore, for example, if a1=3, n1=4, Np=8 Kbytes, and M=64, it follows that:

$$S0:S1=128:1$$

Accordingly, a suitable reference current is obtained.

1.6 Sense Control Circuit 25

The sense control circuit 25 controls the operation timing of the sense module 20. In the first embodiment, a case where the timing of signal XX0 is controlled is taken as an example.

The sense control circuit 25 receives signals at node INV_D from the M number of reference sense modules 24. When the logical states of a predetermined number of nodes in the M number of nodes INV_D are inverted (low to high), the sense operations of the sense modules 20 are terminated. In other words, circuit 25 negates the signal XX0 (or is made low in this example), terminating the discharging of node SEN.

2. Read Operation of Semiconductor Memory Device

Figure 9:
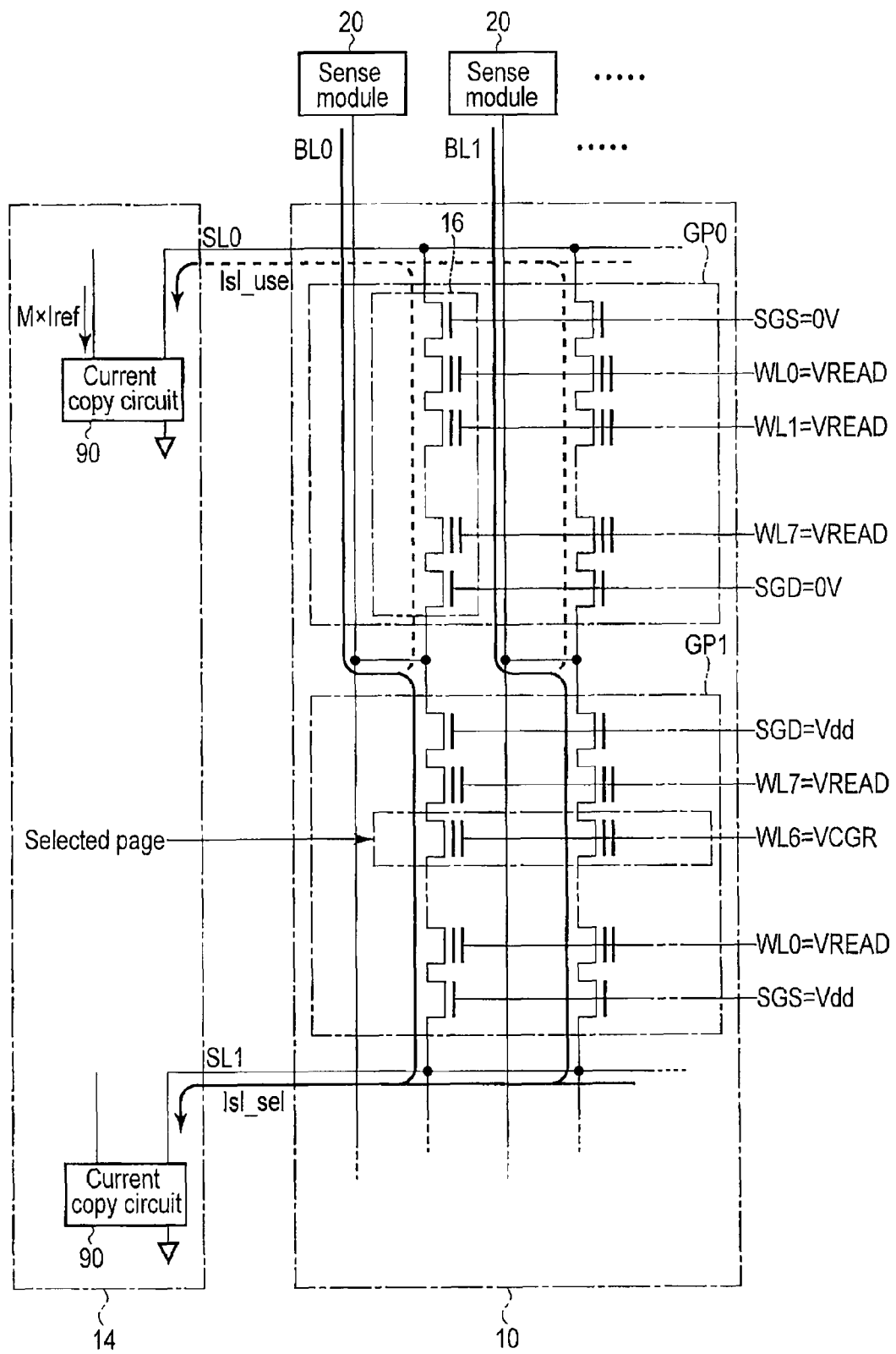
FIG. 9 is a block diagram of the memory cell array and reference current generation module according to the first embodiment.

Next, a read operation of the semiconductor memory device according to the first embodiment will be explained below, focusing attention on the operation of the reference current generation module 14. FIG. 9 is a circuit diagram of the memory cell array 10 and the reference current generation module 14. Hereinafter, an explanation will be given, taking as an example a case where data is read from word line WL6 in the memory cell group GP1.

As shown in FIG. 9, the row decoder 11 applies necessary voltages to word lines WL and select gate lines SGS, SGD. Specifically, the row decoder 11 applies voltage VCGR to the selected word line WL6 and voltage VREAD to the unselected word lines WL0 to WL5 and WL7. VREAD is a voltage that turns on a memory cell transistor MT, regardless of data held by the memory cell transistor. VCGR is a voltage corresponding to a read level. In addition, the row decoder 11 applies voltage Vdd to the select gate lines SGS, SGD in the selected memory cell group GP1 and 0 V to the select gate lines SGS, SGD in the unselected memory cell group GP0. As a result, the select transistors ST1, ST2 in the selected memory cell group GP1 are turned on and the select transistors ST1, ST2 in the unselected memory cell group GP0 are turned off. If the unselected memory cell group GP0 is in the same block as that of the selected memory cell group GP1, a voltage applied to the word lines WL0 to WL7 is the same as in the selected memory cell group GP1. If the unselected memory cell group GP0 is in a block different from that of the selected memory cell group GP1, each of the word lines WL0 to WL7 is made electrically floating.

Furthermore, in the sense module 20, the transistors 60, 61, 66 to 69 are turned on. As a result, not only is the capacitive element 72 charged, but also the bit line BL is precharged to a certain potential. Therefore, if a memory cell transistor MT is turned on the selected page, a cell current flows from the bit line BL to the selected source line SL1. Hereinafter, a source line connected to the selected page is referred to as the selected source line and the other source lines are referred to as the unselected source lines. A current flowing into the selected source line is referred to as Isl_sel.

An off current flowing in the NAND string 16 in the unselected memory cell group GP0 flows into the unselected source line SL0. The current is referred to as Isl_usel. The current copy circuit 90 corresponding to the unselected source line SL0 generates a reference current of (M×Iref) on the basis of current Isl_usel. Each of the reference sense modules 24 senses a reference current Iref generated by the current copy circuit 90 corresponding to source line SL0.

The current copy circuit 90 corresponding to the selected source line SL1 does not contribute to the operation of the reference sense module 24. For example, the reference current generation function itself in the current copy circuit 90 may be disabled. Alternatively, even if a reference current Iref has been generated, the reference sense module 24 may be prevented from selecting a reference current generated by the current copy circuit 90 corresponding to the selected source line SL1.

Thereafter, in the reference sense module 24, if the logic levels of a specific number of nodes INV_D are inverted, the sense control circuit 25 makes signal XX0 low, terminating the sense operation. After this, signal STB is asserted. This turns on the transistor 70 in the sense module 20, thereby transferring the sensed read data to the data latch 64.

3. Effects of the First Embodiment

As described above, the configuration of the first embodiment can improve the operation reliability. This effect will be explained in detail below.

3.1 Read Operation of NAND Flash Memory

In a NAND flash memory, there are process variations, temperature fluctuations, and power supply voltage fluctuations. Therefore, to achieve a proper operation, it is necessary to allow a sufficient margin in designing circuits.

In recent years, new structures with miniaturizing and stacking techniques have been introduced more and more and therefore control of the memory cell performance has been getting much more difficult and a sufficient margin has been getting more difficult to allow for.

For example, in a read operation, an on-current in a memory cell is getting smaller, whereas an off leak current is getting larger. Therefore, it is difficult to obtain a sufficient ratio of on-current to off-current, making it more difficult to secure a read margin.

In a NAND flash memory, data is read by determining whether a cell current flowing through a bit line with a desired potential is larger or smaller than a reference current. In this read method, for example, the following things are pointed out as factors that deteriorate a read margin:

(i) Source line noise (ii) Variations in the characteristics of sense amplifiers due to process variations and fluctuations in temperature and power supply (e.g., variations in the threshold value of a PMOS transistor for determining a node SEN voltage)

As for item (i), for example, the following measures can be considered. In a read operation, current flows through a plurality of memory cells in parallel to read data simultaneously, with the result that a large current flows in the source lines. As a result, the potentials of the source lines rise, which disturbs the read operation. Therefore, reading is performed a plurality of times in such a manner that memory cells in which larger cell currents flow are read from earlier. Then, after a bit lines connected to the memory cells already read from have been grounded, memory cells in which smaller cell currents flow are read from. By doing this, there is no memory cell in which a larger current flows when a cell in which a smaller cell current flow is read from. Therefore, currents flow in the source lines decrease, suppressing variations in the read operation. In addition, there is a method of controlling the source voltage to a suitable value.

As for item (ii), for example, the following measures can be considered. A sense amplifier discharges node SEN charged to Vdd by a cell current. If the voltage at node SEN has been discharged to Vdd−|Vtp| or lower after the sense operation has been terminated, it is determined that the memory cell has been on. If the voltage has been discharged to Vdd−|Vtp| or higher, it is determined that the memory cell has been off. Therefore, if the voltage at node SEN is set so as to just reach trip point Vdd−|Vtp| when a reference current for distinguishing between an on current and an off current flows, it is possible to determine whether a memory cell is on or off by determining the voltage at node SEN.

Actually, the trip point has a certain range due to a variation in the power supply voltage Vdd or a variation in the threshold value Vtp caused by a temperature variation or a process variation. Therefore, to secure a read margin, it is necessary to perform setting so that a reference current may have a range, taking those variations into account. Therefore, if the on/off ratio is not sufficient, it is impossible to determine whether a memory cell is on or off by reading the cell.

To overcome this problem, a method of using a reference sense amplifier has been proposed as the idea of suppressing variations in a circuit typified by variations in the threshold value of a pMOS transistor for determining a voltage at node SEN. In this method, a reference current equal to a sense current for determining an on current and an off current is caused to flow in the reference sense amplifier that has the same characteristic as that of the sense amplifier in variations. If the reference current causes the potential at node SEN to drop to Vdd−|Vtp| or lower, the timing of the drop is sent to the control circuit. On the basis of the timing, a signal necessary to control the sense amplifier is generated and sent to the sense amplifier.

Since the sense time obtained from the reference sense amplifier is produced, taking into account temperature and variations in processes when a read operation is being performed, the variations can be compensated for.

However, it is necessary to set the reference current at a possibly suitable value on the basis of a previously estimated value of the on/off current. That is, when the cell current fluctuates due to process variations, the reference current is set accordingly. In addition, it is necessary to cause the reference current to have the same temperature characteristic as that of the cell current.

As described above, although the read method using the reference sense amplifier can suppress the deterioration of the margin by variations in the sense amplifier, it is difficult to set the reference current to a suitable value.

That is, to obtain a sufficient read margin, it is necessary to take into account not only variations in the characteristic of the circuit that senses read data but also variations in the reference current. However, with the above method, even if variations in the characteristic of the circuit can be compensated for, variations in the cell current cannot be compensated for.

3.2 First Embodiment

In this respect, with the first embodiment, the above problems can be solved. In the configuration of the first embodiment, there is provided a reference sense module 24 formed on the same substrate as the sense module 20. Of course, variations in the characteristic of the circuit, including process variations, in the sense module are almost the same as those in the reference module 24. Therefore, variations in the characteristic of the sense module 20 can be compensated for.

Furthermore, the reference current Iref is generated on the basis of current Isl_usel actually flowing in a source line SL. Specifically, the reference current Iref is generated by multiplying Isl_usel by a suitable value. Therefore, the reference current Iref has the same variations as those in current Isl_usel. The variations are almost equivalent to variations in cell current Isl_sel. That is, if cell current Isl_sel fluctuates, the reference current Iref also fluctuates in the same manner. Therefore, variations in the cell current can also be compensated for.

Particularly in the case of a three-dimensional stacked NAND flash memory as explained in FIGS. 3 and 4, there is no junction leak differently from a general planer NAND flash memory. That is, an off leak current all flows into the source line SL without flowing in the substrate. Therefore, the current flowing in the source line SL amounts to the sum total of the currents flowing in the bit lines BL (or the average value when being divided by the page size), regardless of the memory cells turning on or off.

The current flowing into the source line SL from an unselected block (or an unselected memory cell group) is equal to the off leak current of the NAND string 16 multiplied by the number of NAND strings connected to the source line SL.

Accordingly, an off-current Ioff per bit line can be determined by multiplying the source current by a suitable value. Therefore, in the first embodiment, a reference current Iref is generated on the basis of the off-current Ioff per bit line and is sensed by the reference sense module 24. This makes it possible to secure a maximum read margin.

4. Modification of the First Embodiment

In the first embodiment, when a reference current Iref is generated, only one unselected source line SL has been used. However, two or more unselected source lines SL may be used. FIG. 10 is a block diagram of a memory cell array 10 and a reference current generation module 14 using two unselected source lines SL.

As shown in FIG. 10, suppose a page in a memory cell group GP2 connected to source line SL2 is selected. In this case, current Isl_usel flowing in two unselected source lines SL0, SL1 electrically isolated from source line SL2 may be used to generate a reference current.

In this case, current copy circuits 90 are provided for source lines in a one-to-one correspondence in the current generation module 14. A current copy circuit 90 for source line SL0 generates (M/2)·Iref using current Isl_usel flowing in source line SL0. A current copy circuit 90 for source line SL1 generates (M/2)·Iref using current Isl_usel flowing in source line SL1. Then, (M×Iref) is produced from the sum of them. Thereafter, Iref is supplied to each of the reference sense modules 24.

Of course, three or more unselected source lines may be used. Moreover, all the unselected source lines may be used. If the number of source lines used is k, each of the current copy circuits 90 generates (M/k)·Iref. An unselected source line to be used may be used in an unselected block different from or in the same block as a block to which the selected page belongs.

Second Embodiment

Next, a semiconductor memory device according to a second embodiment will be explained. The second embodiment is such that any one of the memory cell groups GP is used as a ROM fuse in the first embodiment. Hereinafter, only what differs from the first embodiment will be explained.

1. Configuration and Operation of the Second Embodiment

Figure 11:
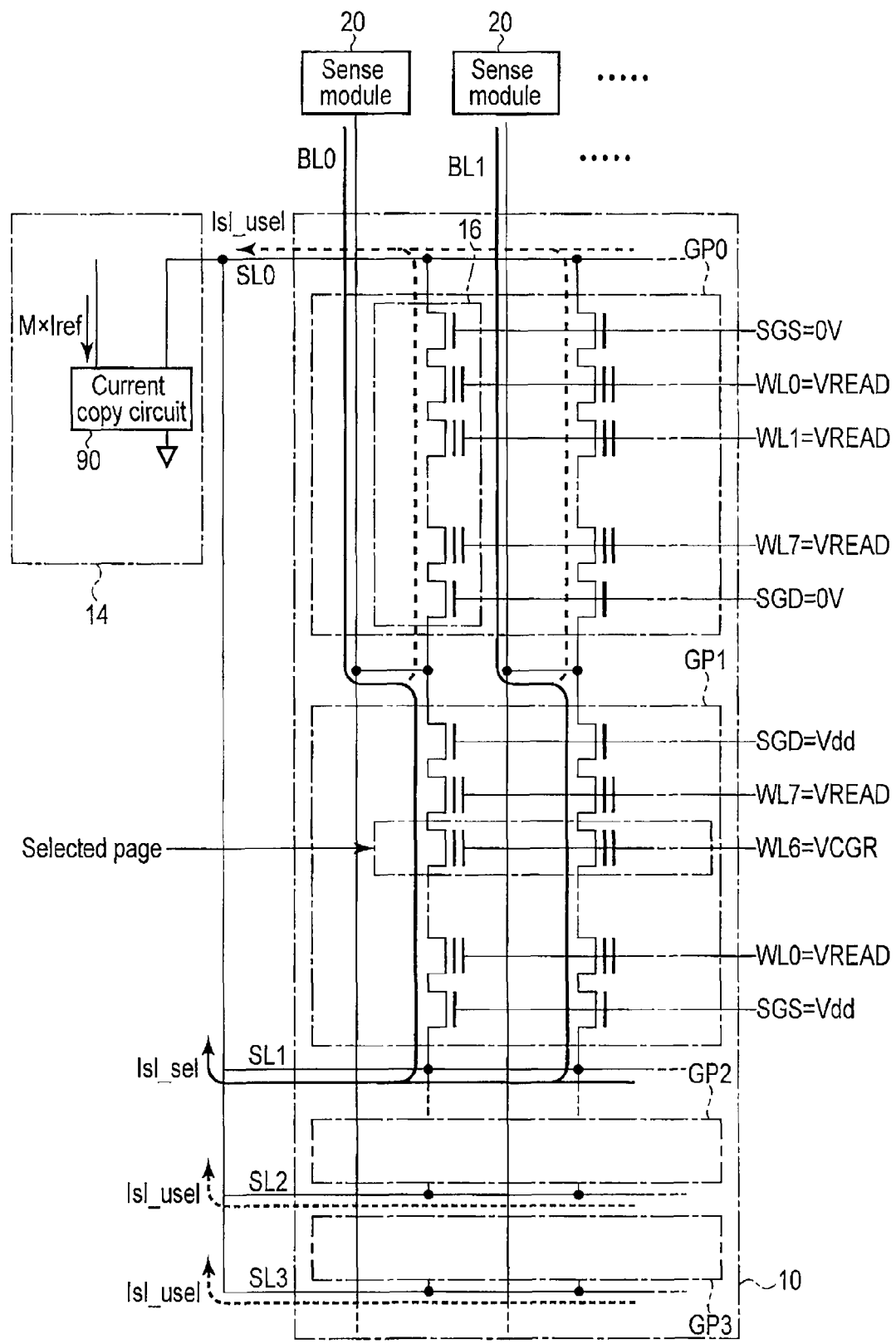
FIG. 11 is a block diagram of a memory cell array and a reference current generation module according to a second embodiment.

FIG. 11 is a block diagram of a memory cell array 10 and a reference current generation module 14 according to the second embodiment, showing a case where data is read from the memory cells connected to word line WL6 of memory cell group GP1.

The configuration and operation of the semiconductor memory device according to the second embodiment are almost the same as those in the first embodiment, except for the following points:

Some region of the memory cell array 10 is used as a ROM fuse. In the example of FIG. 11, memory cell group GP1 is used as a ROM fuse. Therefore, page data of memory cell group GP1 is complementary. The number of memory cells that hold "0" data is equal to (or almost equal to) the number of memory cells that hold "1" data.

When data is read from memory cell group GP1, the reference current generation module 14 generates a reference current Iref using current Isl_usel flowing in all the unselected source lines in the memory cell array 10 and current Isl_sel flowing in the selected source line SL1. An operation performed when data is read from a region other than the ROM fuse is the same as in the first embodiment.

2. Effects of the Second Embodiment

As described above, the method explained in the first embodiment can be applied to the reading of the ROM fuse. In addition, a remarkable effect is produced in reading the ROM fuse. This effect will be explained below.

The ROM fuse is a memory that holds such information as includes various operating conditions of the semiconductor device. In a NAND flash memory, some region of the memory cell array is used as a ROM fuse. For example, when the power supply is turned on, first, data is read from the ROM fuse. On the basis of the read data, various settings are performed (e.g., a sense time is set), enabling the semiconductor memory device to operate under suitable parameters.

That is, when data is read from the ROM fuse, each parameter has not reached its optimum value yet and it may be said that operation errors, such as erroneous reading, are liable to occur. Therefore, in this case, it is desirable that the method of generating reference current Iref explained in the first embodiment should be applied. This makes it possible to read data in the ROM fuse properly.

Since the data in the ROM fuse is important, it has to be read more accurately than the other data. Therefore, in the ROM fuse, one bit of data is held as complementary data in the memory cell transistors of two different NAND strings on the same page. That is, on each page, the number of memory cells that hold "0" data is equal to the number of memory cells that hold "1" data. Therefore, an average value of an on-current and off-current can be obtained by dividing current Isl_sel flowing in the selected source line (source line SL1 in FIG. 11) by the page size. Accordingly, current Isl_sel can be used to generate reference current Iref. Therefore, source lines need not be electrically isolated differently from the first embodiment. That is, in FIG. 11, source lines SL0, SL1 may be connected to a common node.

In the example, the magnitude of a preferable reference current is expressed as:

$$Iref=(Ion+Ioff)/2$$

To obtain such Iref, the ratio of the size (e.g., transistor number or gate width) of transistor 93 to that of transistor 92 is expressed as:

$$S0:S1=M/Np:1$$

As described above, S0 is the size of transistor 93 and S1 is the size of transistor 92. Therefore, for example, if Np=8 Kbytes and M=64, it follows that:

$$S0:S1=1024:1$$

This enables a suitable reference current to be obtained.

In the second embodiment, all the unselected source lines have been used to generate Iref. To obtain Iref=(Ion+Ioff)/2, it is desirable that all the unselected source lines should be used. However, even if Iref deviates from (Ion+Ioff)/2, all the unselected source lines not always have to be used, provided that the deviation is within an allowable range. Only a part of the unselected source lines may be used.

Third Embodiment

Next, a semiconductor memory device according to a third embodiment will be explained. The third embodiment is such that a reference current Iref generated by the reference current generation module 14 is varied according to the number of memory cells to be sensed in the first and second embodiments. Hereinafter, only what differs from the first and second embodiments will be explained.

1. Configuration of Semiconductor Memory Device

FIG. 12 is a circuit diagram of a current copy circuit 90 according to the third embodiment. As shown in FIG. 12, the current copy circuit 90 of the third embodiment is such that each of the transistors 92, 93 is formed by a plurality of n-channel MOS transistors in the configuration of FIG. 8 explained in the first embodiment.

As shown in FIG. 12, the transistor 92 includes an n-channel MOS transistor 95. The transistor 92 further includes a pair of n-channel MOS transistors 96 and 97. The transistor 92 further includes a plurality of pairs of n-channel MOS transistors 98 and 99. The transistors 95, 96, 98 have their gates connected to an output node of a comparator 94 and their drains connected to a common node. Currents flowing to the common node amount to (M×Iref). The source of transistor 95 is grounded. The transistor 97 has its drain connected to the source of transistor 96 and its source grounded. A signal LSEL is input to the gate of the transistor 97. The transistors 99 are provided for the transistors 98 in a one-to-one correspondence. A transistor 99 has its drain connected to the source of the corresponding transistor 98 and its source grounded. A control signal L<m> (m being any one of 1 to 8) is input to the gate of the transistor 99.

The transistor 93 includes a pair of n-channel MOS transistors 100 and 101. The transistor 93 further includes a plurality of pairs of n-channel MOS transistors 102 and 103. The transistors 100, 102 have their gates connected to the output node of the comparator 94 and their drains connected to a common node. The common node is connected to a source line SL. The transistor 101 has its drain connected to the source of transistor 100 and its source grounded. A signal USEL is input to the gate of the transistor 101. The transistors 103 are provided for the transistors 102 in a one-to-one correspondence. A transistor 103 has its drain connected to the source of the corresponding transistor 102 and its source grounded. A control signal U<m> (m being any one of 9 to 16) is input to the gate of the transistor 103.

In FIG. 12, the numbers (1, 2, 4, 8, . . . ) written above the transistors 95, 96, 98, 100, 102 respectively indicate the sizes of the transistors (e.g., the gate widths, the number of transistors (the number of transistors connected in parallel) constituting these transistors, or current drive power). Therefore, the largest transistor 98 has 256 times the magnitude (current supply capacity) of the smallest transistor 95.

With the above configuration, the transistor 95 is enabled by default. In contrast, the transistors 96, 98, 100, 102 are switched between enable and disable by the transistors 97, 99, 101, 103, respectively. The switching is done by control signals LSEL, USEL, L<i>, and U<i>. Control signals LSEL, USEL, L<i>, and U<i> are supplied by, for example, a state machine (not shown) and are controlled according to the number of memory cells to be sensed. These control signals are supplied as follows:

$$U<m>=N<m>|N<16>$$

$$L<m>=/N<m>\&/N<m+1>\&\ldots\&/N<15>\&/N<16>$$

$$USEL=/N<9>\&/N<10>\&\ldots\&/N<15>$$

$$LSEL=/N<9>\&/N<10>\&\ldots\&/N<15>\&/N<16>$$

where the individual bits are represented as N<16>, N<15>, . . . N<0> when the number N2 of memory cells to be sensed is expressed in binary form. In addition, "/" means inversion. "&" means logical AND operation. "|" means logical OR operation.

FIG. 13 is a table, for the current copy circuit 90 of FIG. 12, showing the relationship between the number of memory cells to be sensed and the ratio of a current flowing in the source line SL (on the Isrc side) to a reference current Iref.

As shown in FIG. 13, with the configuration of the third embodiment, setting of 145 types is available. When the number of memory cells to be sensed ranges from 0 to 1, setting "1" is selected, with the result that the ratio of the source current to the reference current is 1:512. That is, the reference current is made overwhelmingly larger. When the number of memory cells to be sensed ranges from 512 to 1023, setting "10" is selected, with the result that the ratio of the source current to the reference current is 1:1. When the number of memory cells to be sensed ranges from 65024 to 65535, setting "144" is selected, with the result that the ratio of the source current to the reference current is 127:1. When the number of memory cells to be sensed is 65536, setting "145" is selected, with the result that the ratio of the source current to the reference current is 128:1.

As in the first embodiment, in the third embodiment, the explanation is given on the assumption that a1=3, n1=4, Np=8 Kbytes, and M=64.

2. Read Operation of Semiconductor Memory Device

Next, a read operation of the semiconductor memory device according to the third embodiment will be explained. FIG. 14 is a flowchart to explain a read operation and FIG. 15 is a timing chart to explain various signals when data is read. Suppose node INV has been set to a low level by signal RST.

As shown in FIG. 14, first, the bit lines BL are precharged (step S20), causing data to be read from all the bit lines BL (step S11). Specifically, as shown in FIG. 15, at time t0, signal BLS is made high, turning on transistor 60 in the sense module 20. At time t1, signals BLC, BLX, HH0, and XX0 are made high. This turns on transistors 61, 67, 68, 69 in the sense module 20. Since node INV is low in the initial state, transistor 66 is on. Accordingly, the bit line is precharged and a cell current flows from the bit line BL to the source line SL. In addition, the capacitive element 71 is charged, with the result that the potential at node SEN rises. Moreover, the reference current generation module 14 generates a reference current Iref.

Next, at time t2, signal HH0 is made low, turning off transistor 68. As a result, the capacitive element 72 is discharged, causing the potential at node SEN to drop. The degree of the drop depends on whether the memory cell transistor MT is on or off.

Next, at time t3, signal XX0 is made low, turning off transistor 69. Accordingly, the potential at node SEN is caused to remain constant. As described above, this timing is controlled by the sense control circuit 25.

Thereafter, at time t4, signal STB is made low, turning on transistor 70 and turning off transistor 75. If transistor 71 is on according to the level of node SEN, a high level (Vdd) is transferred to node INV. If transistor 71 is off, node INV remains low. In FIG. 15, the broken lines for the potentials of nodes SEN and INV and bit line BL show a case where transistor 71 is turned on, that is, when a cell current has flown sufficiently. This completes a first sense operation (step S12).

In the sense module 20 where node INV has been made high in the first sense operation, transistor 66 is turned off and transistor 80 is turned on. This stops the precharging of the bit line. At the same time, the potential of the bit line is fixed to a low level (e.g., 0 V) by transistor 80. That is, the bit line BL connected to a memory cell transistor MT determined to have been turned on is fixed to GND (step S13).

In a sense module 20 where node INV remains low in the first sense operation, a second sense operation is performed. Specifically, signals HH0 and XX0 are asserted, charging node SEN (step S14). In addition, signal STB is made high. Thereafter, the same operation as the first sense operation is performed. The second sense operation differs from the first sense operation in that a reference current Iref generated during a second sense operation is generated according to the number of memory cells sensed in the second sense operation (step S15). That is, Iref is kept constant by changing the size of transistor 92 and/or transistor 93 according to the number of memory cells to be sensed. Specifically, the number of memory cells to be sensed in the second sense operation generally becomes smaller than that in the first sense operation. Accordingly, the size of transistor 92 is made larger and/or the size of transistor 93 is made smaller. This is achieved by the state machine supplying control signals SEL, L<m>, and U<m> according to the number N2 of memory cells to be sensed. By doing this, the reference current Iref is controlled so as to have the same value in both the first and second sense operations. Then, signal STB is made low, which completes the second sense operation (step S16).

3. Effects of the Third Embodiment

To suppress erroneous reading due to a increase of the source line potential, it is preferable to perform two or more readings. Of course, the number of memory cells that requires more than two readings depends on data patterns.

Therefore, in the third embodiment, the number of memory cells that requires another sense operation after the first sense operation is counted (by, for example, the state machine or the like that has received the sense result from a sense module). On the basis of the number of the memory cells, the reference current generation module 14 is controlled, generating a suitable reference current Iref. Specifically, the number of memory cells to be sensed in the second sense operation is generally smaller than that in the first sense operation. Accordingly, current Isl_usel flowing in the unselected source line also decreases. To compensate for a decrease in the current, the sizes of transistors 92, 93 are made variable. This enables a suitable reference current to be generated constantly even when the number of memory cells to be sensed varies.

While in the explanation, Iref has been the same in the first and second sense operations, they are not necessarily the same. Iref may vary in a specific allowable range.

Fourth Embodiment

Next, a semiconductor memory device according to a fourth embodiment will be explained. Unlike the third embodiment, the fourth embodiment is such that the number of reference sense modules 24 to be enabled is varied according to the number of memory cells to be sensed. Hereinafter, only what differs from the first to third embodiments will be explained.

1. Configuration of Semiconductor Memory Device 1.1 Current Copy Circuit 90

Figure 16:
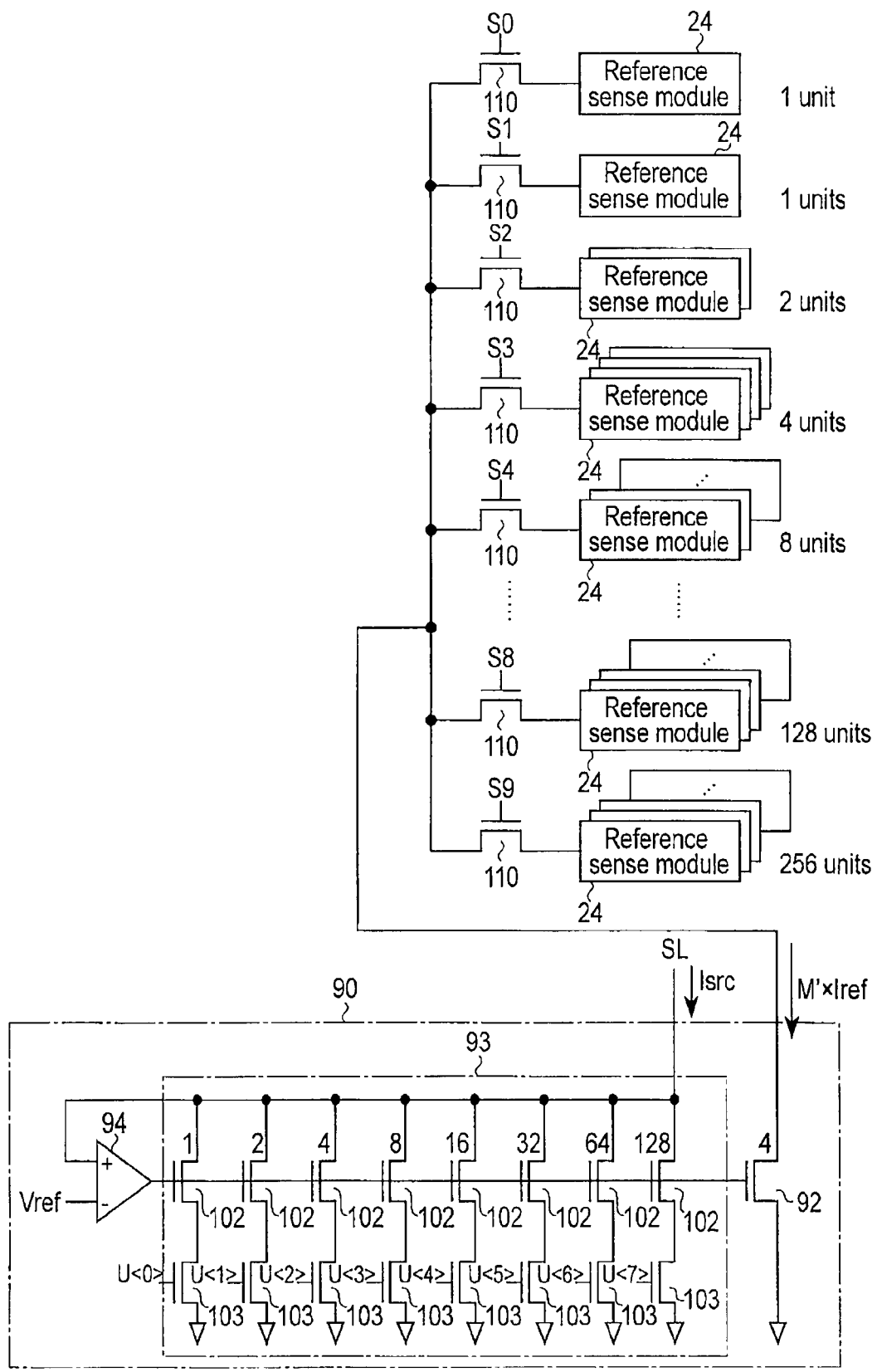
FIG. 16 is a block diagram of a reference current generation module and a reference sense module according to a fourth embodiment.

First, the configuration of a current copy circuit 90 will be explained with reference to FIG. 16. FIG. 16 is a circuit diagram of a current copy circuit 90 and a reference sense module 24.

As shown in FIG. 16, the current copy circuit 90 is such that the configuration of FIG. 12 explained in the third embodiment is modified as follows:

Transistors 100, 101 are eliminated in transistor 93.

Transistor 102 that has 128 times the size (current drive power) of transistor 100 is added in transistor 93.

Signals U<0> to U<7> are input to the gates of transistors 103 in ascending order of size.

The size of transistor 92 is fixed. The size is, for example, four times the smallest size of transistor 102.

Signal U<m> is supplied by, for example, the state machine as follows:

$$U<m> = N<m> \& (/N<7> \& /N<8> \& \ldots \& /N<15> \& /N<16>)$$

where m=0 to 6.

In addition, U<7>=N<7>|N<8>| ... |N<15>|N<16>

1.2 Connection Between Current Copy Circuit 90 and Reference Sense Module 24

As shown in FIG. 16, the reference sense modules 24 are divided into a group of one module, a group of one module, a group of two modules, a group of four modules, a group of eight modules, a group of 16 modules, a group of 32 modules, a group of 64 modules, a group of 128 modules, and a group of 256 modules. Current Iref is supplied via a MOS transistor 110 to each group. Signals S0 to S9 are supplied to the gates of the corresponding transistors 110 by, for example, a state machine. The state machine determines the number M' of reference sense modules 24 to be used by making signals S0 to S9 high according to the number of memory cells to be sensed.

Signals S0 to S9 are as follows:

$$S0 = (/N<7> \& /N<8> \& \ldots \& /N<15>) | N<16>$$

$$S1 = N<7> | N<16>$$

$$S2 = N<8> | N<16>$$

$$S3 = N<9> | N<16>$$

$$S4 = N<10> | N<16>$$

$$S5 = N<11> | N<16>$$

$$S6 = N<12> | N<16>$$

$$S7 = N<13> | N<16>$$

$$S8 = N<14> | N<16>$$

$$S9 = N<15> | N<16>$$

That is, when N<7>=1 or when N<7> to N<16> are all "0," only one reference sense module 24 is enabled. When N<8> to N<16> are "1," 2 to 256 reference sense modules are enabled. When N<16>=1 (i.e., N2=65536), all the reference sense modules 24 are enabled.

Figures 17, 18:
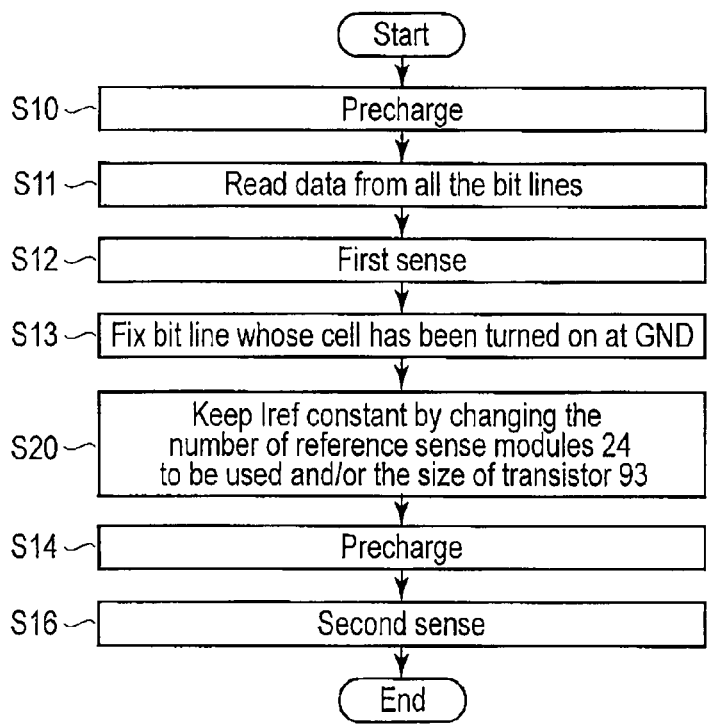
FIG. 17 is a table showing reference currents generated by a current copy circuit according to the fourth embodiment.
FIG. 18 is a flowchart to explain a data reading method according to the fourth embodiment.

1.3 Relationship Between the Number of Memory Cells, the Number of Reference Sense Modules, and Currents FIG. 17 is a table showing the relationship between the number N2 of memory cells to be sensed, the number M' of reference sense modules 24 to be used, and the ratio of current flowing in a source line SL (on the Isrc side) to reference current Iref.

As shown in FIG. 17, with the configuration of the fourth embodiment, setting of 639 types is available. When the number of memory cells to be sensed is one, setting "1" is selected. With setting "1," only one reference sense module 24 is used. Specifically, signal S0 is made high and signals S1 to S9 are made low. The ratio of the source current to the reference current is set to 1:4 by controlling the size of transistor 93.

When the number of memory cells ranges from 1 to 255, the number of reference sense modules 24 to be used is only one. As the number of memory cells increases, the ratio of Isrc becomes higher.

When the number of memory cells ranges from 256 to 383, setting "129" is selected. With setting "129," two reference sense modules 24 are used. Specifically, signal S2 is made high and signals S0, S1, S3 to S9 are made low. The ratio of the source current to the reference current is set to 128:4.

When the number of memory cells is 65536, setting "639" is selected. With setting "639," 512 reference sense modules 24 are used. Specifically, signals S0 to S9 are all made high. The ratio of the source current to the reference current is set to 128:4.

Unlike the third embodiment, the fourth embodiment has been explained on the assumption that a1=3, n1=2, Np=8 Kbytes, and M=512 to simply the explanation, where M is the sum total of reference sense modules 24 and the number of reference sense modules used in the total sum is M'.

2. Read Operation of Semiconductor Memory Device

Next, a read operation of the semiconductor memory device according to the fourth embodiment will be explained. FIG. 18 is a flowchart to explain a read operation.

As shown in FIG. 18, the data read method according to the fourth embodiment is such that step S15 is eliminated in FIG. 15 explained in the third embodiment and that Iref is kept constant by changing the number of reference sense modules 24 to be enabled and/or the size of transistor 93 according to the number of memory cells to be sensed in a second sense operation before the second sense operation is performed (step S20). That is, the number of reference sense modules 24 used is kept constant and the size of transistor 93 is made larger as the number of memory cells is larger, until the number of memory cells has reached a specific number (255 in the example of FIG. 17). That is, in a range that can be dealt with by a current copy circuit 90, the current copy circuit 90 is used for constant Iref. When the number of memory cells has exceeded a specific number, the source current from then on is dealt with by changing the number of reference sense modules 24. That is, as the number of memory cells is larger, the number of reference sense modules 24 used is increased.

3. Effects of the Fourth Embodiment

As described above, with the configuration of the fourth embodiment, changing the number of reference sense modules used makes it possible to control the magnitude of Iref supplied to each reference sense module 24 suitably, producing the same effect as in the third embodiment.

In the fourth embodiment, the magnitude of the reference current is changed when the number of memory cells ranges from 1 to 255 and the number of reference sense modules used is changed when the number of memory cells is not in the range of 1 to 255. However, only the number of reference sense modules used may be changed without changing the magnitude of the reference current. Alternatively, both the magnitude of the reference current and the number of reference sense modules used may be change at the same time according to the number of memory cells. This can make the magnitude of the reference current practically constant in a first and a second sense operation.

[Modifications]

As described above, the semiconductor memory device according to the embodiments includes a memory cell array 10, a bit line BL, a source line SL, and a sense circuit 13. The memory cell array 10 includes memory strings 16 which include memory cells MT connected in series and stacked above a semiconductor substrate 40. A bit line BL is coupled to one of the memory strings 16 and transfers data. A source line SL is coupled to one of the memory strings 16. When data is read, a read current from the bit line BL flows into the source line SL. A sense circuit 13 is coupled to the bit line BL and senses read data. An operation timing of the sense circuit 13 is determined on the basis of the current flowing through the source line SL.

This makes it possible to control the operation timing of the sense circuit, taking a fluctuation in the cell current into account, which enables a higher-accuracy operation.

The embodiments are not limited to what has been explained above and may be modified variously. For example, the operation timing of the sense module 20 determined by the sense control circuit 25 on the basis of the reference current Iref is not limited to signal XX0 and may be based on signal STB or the like. Still other timing may be used. The size of each transistor in the current copy circuit 90 has been explained with reference to concrete examples. They are only illustrative and may be set suitably as needed. The same holds true for the number of reference sense modules 24 and for the relationship shown in each of FIGS. 13 and 17.

In the third embodiment, current Tref is controlled so as to be the same in the first and second sense operations. However, Iref in the first sense operation may be set larger than Iref in the second sense operation. In the first sense operation, data is read from only the memory cells whose the cell current is large. Therefore, Iref may be set to sense relatively large on-current. As stated above, Iref is controlled to have different value between the first sense operation and the second sense operation.

Specifically, Iref in the first sense operation may be set to twice Iref in the second sense operation. For example, assume that N'<16:0> is the half of the number N<16:0> described in the third embodiment. In the second sense operation, control signals U<m>, L<m>, USEL, and LSEL are determined based on the number N<16:0> as in the third embodiment. In contrast, control signals U<m>, L<m>, USEL, and LSEL are determined based on the number N'<16:0> in the first operation. As a result, Iref in the first sense operation is set to twice Iref in the second sense operation. More specifically, in the structure of the third embodiment, the multiplication factor for generating Iref from Isrc is adjusted using the number N<16:0>. Assume that Iref is set to Iref1 (=(K×Isrc)), when the number of cells for reading is large (N cells). In this case, when the number of cell for reading is decreased to N/2, the circuit sets the Iref to Iref2 (=(2×K×Isrc')) since Isrc is decreased by half (Isrc is decreased to Isrc' (=Isrc/2)). To increase to twice Iref for reading N cells in first sense operation, Iref is generated by applying the multiplication factor for N/2 cells to Isrc for N cells. That is, Iref1'(=(2×K×Isrc)=(2× Iref1)) is generated. Of course, Iref in the first operation is not limited to twice Iref in the second operation.

The same is true of the fourth embodiment. That is, the number of enabled reference sense modules 24 and/or current copy circuit 90 is suitably controlled to allow Iref flowing through each enabled reference sense module 24 to have different value between the first sense operation and the second sense operation (for example, Iref flowing through each enabled reference sense module 24 in the first operation is larger than that in the second operation).

Specifically, in the second sense operation, control signals U<m>, U<7>, and S0 to S9 are determined based on the number N<16:0> as in the third embodiment. In contrast, control signals U<m>, U<7>, and S0 to S9 are determined based on the number N'<16:0> in the first operation.

Iref may be controlled as described above by, for example, the state machine (not shown in figure).

Furthermore, in the embodiments, the semiconductor memory device has been explained, taking a three-dimensional stacked NAND flash memory as an example. However, the embodiments are not limited to this. That is, the embodiments can be applied to a cross-point semiconductor memory in general where memory cells are formed at interconnection where interconnections in a direction cross interconnections in another direction. Such semiconductor memories include magnetic RAMs (MRAMs) and resistive RAMs (ReRAMs). The embodiments can applied to not only a three-dimensional stacked semiconductor memory but also a conventional NAND flash memory where memory cells are arranged two-dimensionally in a plane of a semiconductor substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of memory strings including memory cells connected in series and stacked above a semiconductor substrate;
   bit lines electrically coupled to one of the memory strings;
   source lines electrically coupled to one of the memory strings;
   a sense circuit electrically coupled to one of the bit lines;
   a generation module configured to generate a reference current based on a current flowing through the source line;
   a reference sense circuit configured to sense the reference current; and
   a sense control circuit configured to control an operation timing of the sense circuit based on a sense operation,
   wherein the operation timing of the sense circuit is determined based on the current flowing in the source line.

2. The device according to claim 1, wherein the plurality of memory strings include a first memory string electrically coupled to the bit lines and a first source line and a second memory string electrically coupled to the bit lines and a second source line,
   the second source line is electrically isolated from the first source line, and
   the operation timing of the sense circuits in reading data from the first memory string is determined based on current flowing through the second source line.

3. The device according to claim 2, further comprises third memory strings coupled to the bit line and a third source line,
the third source line is electrically isolated from the first and second source lines, and
the operation timing of the sense circuit in reading data from the first memory string is determined based on currents flowing through the second source line and the third source line.

4. The device according to claim 1, wherein the plurality of memory strings include a first cell group which includes first memory string and a second memory string electrically coupled to a first source line and a second cell group which includes a third memory string and a fourth memory string electrically coupled to a second source line,
the first source line is electrically coupled to the second source line,
the first and second memory strings hold complementary data to each other, and
the operation timing of the sense circuits in reading data from the first cell group is determined based on currents flowing through the first source lines and the second source line.

5. The device according to claim 4, wherein the first cell group is used as a ROM fuse.

6. The device according to claim 1,
wherein the operation timing of the sense circuits is determined based on the sense operation timing of the reference current by the reference sense circuit,
the sense circuits sense data by at least two sense operations and omit a second sense operation for a column determined to be on in a first sense operation, and
a magnitude of the reference current generated by the generation module and/or or the number of reference sense circuits used are variable according to the number of memory cells to be sensed.

7. The device according to claim 6, wherein the generation module includes:
a first transistor, a source of which is connected to the source line; and
a second transistor, a drain current of which is a drain current, and
a size of the first transistor or a size of the second transistor are variable according to the number of memory cells to be sensed.

8. The device according to claim 6, wherein the magnitude of the reference current flowing through each of the reference sense circuits is substantially constant in the first and second sense operations.

9. The device according to claim 6, wherein
the magnitude of the reference current flowing through each of the reference sense circuits in the second sense operation is smaller than that in the first sense operation.

10. The device according to claim 6, wherein the memory string includes:
a pillar semiconductor layer electrically isolated from the semiconductor substrate,
a gate insulating film disposed to surround the semiconductor layer,
a charge storage layer disposed to surround the gate insulating film,
a block layer disposed to surround the charge storage layer, and
a plurality of gate electrodes disposed to surround the block layer, and
the semiconductor layer has one end electrically coupled to the bit line and the other end electrically coupled to the source line.

11. A method of reading data from a semiconductor memory device including a plurality of memory strings including memory cells connected in series and stacked above a semiconductor substrate, the method comprising:
selecting a first memory string from the memory strings and allowing a cell current to flow in a bit line electrically coupled to the first memory string;
generating a reference current based on currents flowing through source lines electrically coupled to unselected second memory strings;
sensing the reference current; and
sensing the cell current with the timing based on the result of sensing the reference current,
wherein the sensing the cell current is performed on a plurality of columns simultaneously,
second sensing is performed on a column in which a memory cell has been determined to be off after the cell current has been sensed, and
a magnitude of the reference current or a number of reference sense circuits which sense the reference current are variable according to a number of memory cells to be sensed.

12. The method according to claim 11, wherein the first memory string is electrically coupled to a first source line, and
the second memory string is electrically coupled to a second source line electrically isolated from the first source line.

13. The method according to claim 12, wherein the reference current is generated further based on a third source line electrically coupled to an unselected third memory string, and
the third source line is electrically isolated from the first and second source lines.

14. The method according to claim 11, wherein the first memory string is electrically coupled to the source line and
the first memory string is used as a ROM fuse.

15. The method according to claim 11, wherein the magnitude of the reference current flowing through each of the reference sense circuits is substantially constant in the first and second sense operations.

16. The method according to claim 11, wherein the magnitude of the reference current flowing through each of the reference sense circuits in the second sense operation is smaller than that in the first sense operation.

* * * * *